United States Patent
Sakimura

(10) Patent No.: US 6,507,302 B2
(45) Date of Patent: Jan. 14, 2003

(54) MULTI-BIT ΔΣ A/D CONVERTER

(75) Inventor: Noboru Sakimura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/944,185

(22) Filed: Sep. 4, 2001

(65) Prior Publication Data

US 2002/0175846 A1 Nov. 28, 2002

(30) Foreign Application Priority Data

Sep. 1, 2000 (JP) ........................................ 2000-265935

(51) Int. Cl.[7] .................................................. H03M 3/00
(52) U.S. Cl. ...................................................... 341/143
(58) Field of Search ......................................... 341/143

(56) References Cited

U.S. PATENT DOCUMENTS 5,162,799 A * 11/1992 Tanimoto .................... 341/143
5,949,361 A * 9/1999 Fischer et al. ............... 341/143

* cited by examiner

*Primary Examiner*—Howard L. Williams
(74) *Attorney, Agent, or Firm*—Young & Thompson

(57) ABSTRACT

In the multi-bit A/D converter disclosed by Leslie, since a one-bit feedback is carried out, an output amplitude of an integrator becomes large, and therefore, it is required to be attenuated by a certain constant number time in the analog integrator. Furthermore, a digital quantization noise to be removed is leaked into, and this quantization noise is greatly larger than a quantization noise mixed into with a quantizer, with the result that a SN ratio is remarkably deteriorated. An A/D converter in accordance with the present application includes an n-bit quantizer and a most-significant bit extractor, and further includes a digital processing part receiving an output signal of the most-significant bit extractor, for outputting a sum of the output signal and a value obtained by multiplying a predetermined coefficient and the output signal which was outputted before a predetermined time. Thus, a quantization noise within a signal band can be minimized, and a high precision of conversion can be realized with a low oversampling ratio.

20 Claims, 20 Drawing Sheets

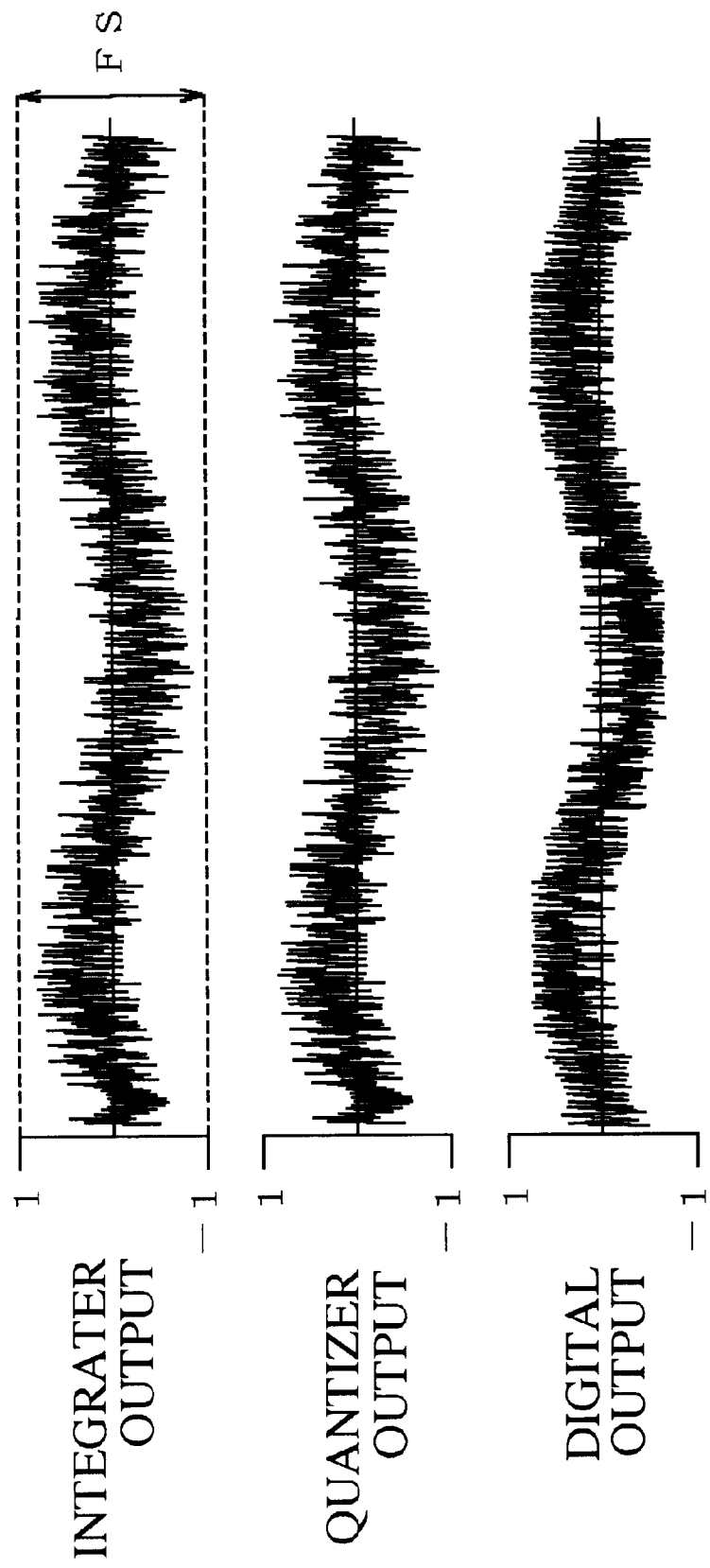

MULTI-BIT ΔΣ A/D CONVERTER

BACKGROUND OF THE INVENTION

The present invention relates to an analog-to-digital converter, and more specifically to a ΔΣ A/D converter constituted of a combination of an oversampling and a noise shaping.

An oversampling A/D converter not only can minimize a quantization noise in a signal band but also can realize a highly precise conversion by making a sampling frequency greatly higher than a Nyquist frequency which is a double of signal band frequency. Namely, a ratio of a signal power to a noise power (called a "SN ratio" hereinafter) is increased. The reason for this is as follows:

The quantization noise generated in a quantizer for converting an analog signal into a digital signal, is a white noise which generates irregularly and distributes over the whole of a frequency region. Assuming that the sampling frequency of the oversampling A/D converter is fs, the noise power distributes from DC to fs/2. If the sampling frequency is remarkably larger than the signal band, the noise power in the signal band correspondingly becomes small. The noise power distributing out of the signal band can be removed by a decimation filter which is located at a later stage in an ordinary practice.

Therefore, the larger the ratio of the sampling frequency fs to the Nyquist frequency fn (called an "oversampling ratio" hereinafter) is, the SN ratio becomes larger.

A ΔΣ A/D converter, which is one kind of the oversampling A/D converter, is a technology having a frequency characteristics of a high pass filter for a noise power distributed from DC to fs/2, so as to further decrease the noise power in a low frequency region. Accordingly, the noise power in the signal band is further reduced. In general, a technology of expelling the noise power in the signal band to the outside of the signal band is known as a noise shaping.

FIG. 10 illustrates a basic structure of a conventional ΔΣ A/D converter. This comprises an analog adder 1 for obtaining a difference between an analog input signal X(z) and an output of a one-bit D/A converter provided in a feedback part, an analog integrator 2 for integrating an output of the analog adder 1, an one-bit quantizer 3 for converting an output of the analog integrator 2 into a digital value, a delay 8 for holding an output of the one-bit quantizer 3 until a next sampling time, and the one-bit D/A converter 6 for converting a one-bit data of the delay 8 into an binary analog signal. A digital output of the one-bit quantizer 3 constitutes an output Y(z) of this ΔΣ A/D converter. Incidentally, the analog integrator 2 has a characteristics of a low pass filter for allowing to only a low frequency component to pass and for cutting off a high frequency component. Seeking a transfer function of this structure, it becomes the following expression (1):

$$Y(z)=X(z)+(1-z^{-1})Q(Z) \quad (1)$$

In this case, since only one analog integrator is provided in a closed loop, the shaping noise of a first-order can be realized. For example, in a ΔΣ A/D converter having two analog integrators in a closed loop, the noise shaping of a second-order is realized, thereby to increase a noise suppression in the signal band.

In a Nyquist sampling A/D converter performing a sampling at a Nyquist frequency, the precision of conversion is determined by precision in the circuit in a voltage axis. In the oversampling ΔΣ A/D converter, however, it is possible to increase the SN ratio by increasing the oversampling ratio or increasing the order of the noise shaping. In other words, since the oversampling ΔΣ A/D converter is a technology for increasing the precision of conversion in a time axis, the precision in the circuit in a voltage axis can be relaxed. Therefore, the precision of conversion is bounded by 12 bits in the Nyquist sampling A/D converter, but the oversampling ΔΣ A/D converter can obtain a further high precision of conversion. For example, in an audio band having a signal band of about 20 kHz, if the oversampling ratio is 64 times with the noise shaping of a third-order, the sampling frequency becomes about 2.5 MHz. In this case, the precision of conversion of 16 bits can be sufficiently realized.

However, considering to what degree a convertible signal band can be enlarged while the precision of conversion, a several 100 kHz is an upper limit. For example, if it is attempted to obtain the precision of conversion compatible to the above example in the signal band of 1 MHz, the sampling frequency becomes 128 MHz with the noise shaping of the third-order. In this case, an unity gain frequency of an operational amplifier used in the integrator is required to be on the order of 500 MHz. However, it is very difficult to design such an operational amplifier, and although it possible, a consumed electric power remarkably increases. If the order of the noise shaping is increased to a fourth-order or A fifth order, the oversampling ratio can be lowered. However, if the order of the noise shaping exceeds the third-order, the closed loop becomes unstable.

In order to realize a stable structure, it is necessary to give an attenuation coefficient ($0<a_i<1$) to the integrator, so that an output amplitude of the integrator never becomes large. For example, FIG. 11 illustrate a basic structure of a stability-considered ΔΣ A/D converter realizing the noise shaping of the third-order. Three analog integrators are provided, and an analog multiplier 9a, 9b and 9c is located behind each analog integrator. The transfer function is expressed by the following expression (2):

$$Y(z)=\{a_1a_2a_3X(z)+(1-z^{-1})Q(z)\}/f(z) \quad (2)$$

where $$f(z)=1+(a_1a_2a_3+a_2a_3+a_3-3)z^{-1}+(3-a_2a_3+2a_3)\,z^{-2}+(a_3-1)\,z^{-3}$$

Namely, the signal component is attenuated by the product "$a_1a_2a_3$" of attenuation coefficients of the respective integrators. Therefore, even if the order is increased, it is not possible to estimate an increase of the SN ratio as expected.

Now, a multi-bit ΔΣ A/D converter is known, which comprises, as shown in FIG. 12, an n-bit quantizer 4 for converting an analog signal into a digital signal of a multi value, and an n-bit D/A converter 7 for converting the multi-bit digital signal of the multi value into an analog signal of a multi value, in place of the one-bit quantizer 3 and the one-bit D/A converter 6. In this A/D converter, by increasing the resolution of the quantizer, the quantization noise Q'(z) becomes small and the noise power distributed over the whole frequency region is decreased. In general, by increasing the resolution of the n-bit quantizer 4 by each one bit, the SN ratio is elevated by each 6 dB. However, the n-bit D/A converter 7 has a non-linear error E(z). The transfer function of the multi-bit ΔΣ A/D converter shown in FIG. 12 becomes as the following equation (3):

$$Y(z)=X(z)+E(z)+(1-z^{-1})Q'(z) \quad (3)$$

The non-linear error E(z) of the n-bit D/A converter 7 is added to the analog signal X(z) with no modification, and the noise shaping is not made. Namely, the SN ratio is remarkably deteriorated by this non-linearity. Therefore, the n-bit D/A converter 7 is required to have the precision comparable to the precision of conversion in the A/D converter. However, it is very difficult to realize the n-bit D/A converter 7 mentioned above, and the circuit scale greatly becomes large. For example, in the case that the n-bit D/A converter 7 is realized in an integrated circuit, many capacitors are required. If a 16-bit D/A converter is constituted using $2^{16}$ unitary capacitors of 5 µm square, a size variation to be controlled in a fabricating process is 4.9 nm, which is a value difficult to realize. In addition, even if such very small capacitors are used, the total area of the capacitors occupies a large area of 1.3 mm square.

One technology for overcoming this problem is disclosed in "An improved ΔΣ modulator architecture", 1990, IEEE, ISCAS, pp372–375, and in U.S. Pat. No. 4,987,416. FIG. 13 illustrates a one-order basic structure of this technology. An analog adder I subtracts from an analog signal X(z) a feedback signal outputted from a one-bit D/A converter 6. An output of the analog adder 1 is supplied to an analog integrator 2, and an output of the analog integrator 2 is digitized by an n-bit quantizer 4. Here, a quantization noise Qa(z) is mixed into. From an n-bit output of the n-bit quantizer 4, only the most significant bit is extracted by a most significant bit extractor 5. Here, a digital quantization noise Qd(z) is mixed into. This most significant bit is held by a delay 8a until a next sampling time, and then, is supplied to a one-bit D/A converter 8a for converting the received signal into a binary analog value. Qd(z) mixed into by the most significant bit extractor 5 is held by a delay 8b until the next sampling time, and is added to the output of the n-bit quantizer 4 at the next sampling time by a digital adder 10. An output of the digital adder 10 constitutes an output Y(z) of this A/D converter. Here, assuming that the output of the n-bit quantizer 4 is Y'(z), the transfer function of Y'(z) becomes as the following expression (4):

$$Y'(z)=X(z)+(1-z^{-1})Qa(z)-z^{-1}Qd(z) \quad (4)$$

Accordingly, the transfer function of the output Y(z) of this A/D converter becomes as the following expression (5):

$$Y(z)=X(z)+(1-z^{-1})Qa(z) \quad (5)$$

Namely, Qd(z), which is far larger than Qa(z), is removed. In this method, since only the most significant bit is fed back, it is possible to use the one-bit D/A converter 6. Since the one-bit D/A converter 6 outputs a binary analog value, the non-linear error E(z) is not essentially mixed into. The expression (5) becomes equal to the transfer function of the expression (3) when E(z)=0, so that the SN ratio comparable to that in the prior art multi-bit ΔΣ A/D converter can be expected.

FIG. 14 illustrate a similarity of FIG. 13. The analog adder 1 subtracts from the analog signal X(z) the feedback signal outputted from the one-bit D/A converter 6. The output of the analog adder 1 is supplied to the analog integrator 2, and the output of the analog integrator 2 is digitized by the n-bit quantizer 4. Here, the quantization noise Qa(z) is mixed into. From the n-bit output of the n-bit quantizer 4, only the most significant bit is extracted by the most significant bit extractor 5. Here, the digital quantization noise Qd(z) is mixed into. This most significant bit is held by the delay 8a until a next sampling time, and then, is supplied to the one-bit D/A converter 8a for converting the received signal into a binary analog value. Qd(z) mixed into by the most significant bit extractor 5 is supplied to a differentiator 12 which outputs a difference from Qd(z) before one sampling time. A difference between the output of the most significant bit extractor 5 and an output of the differentiator 12 is obtained by a digital adder 10. This is an output Y(z) of this A/D converter. Here, assuming that the output of the most significant bit extractor 5 is Y"(z), the transfer function of Y"(z) becomes as the following expression (6):

$$Y''(z)=X(z)+(1-z^{-1})Qa(z)+(1-z^{-1})Qd(z) \quad (6)$$

Accordingly, the transfer function of the output Y(z) of this A/D converter becomes as the following expression (7):

$$Y(z)=X(z)+(1-z^{-1})Qa(z) \quad (7)$$

Namely, the expression (7) is equal to the expression (5), and it has a performance equivalent to the structure shown in FIG. 13.

Similarly, the structure of the second-order and the third-order noise shaping, as disclosed in the above referred publications, is shown in FIG. 15 and FIG. 16. Their similarity is shown in FIG. 17 and FIG. 18. The transfer function of the structure shown in FIG. 15 and FIG. 17 becomes as the following expression (8):

$$Y(z)=X(z)+(1-z^{-1})^2 Qa(z) \quad (8)$$

The transfer function of the structure shown in FIG. 16 and FIG. 18 becomes as the following expression (9):

$$Y(z)=X(z)+(1-z^{-1})^3 Qa(z) \quad (9)$$

The system disclosed in the above referred publications has the following problems. In the conventional ΔΣ A/D converter using the one-bit quantizer, the quantization is carried out by comparing the output of the integrator with one threshold level of the quantizer. Accordingly, no limit exists in the amplitude of the output of the integrator, so that even if the output of the integrator is very large, the output of the quantizer does not change. However, in the multi-bit ΔΣ A/D converter, since the quantizer supplies an output of a plurality of bits, the quantizer has a plurality of threshold levels. Accordingly, the output of the integrator must be restricted to the same extent as a full scale of the quantizer. For example, if a four-bit quantizer is used, a outputted digital data is a hexadecimal value. Therefore, the quantizer is required to have 15 threshold levels. Assuming that the full scale of the input voltage of the quantizer is −1V to +1V, a voltage corresponding to one LSB becomes 125 mV. Accordingly, if the amplitude of the output voltage of the integrator is in the range of −1.0625V to +1.0625V, the quantization noise uniformly distributes with the maximum value of ±62.5 mV. However, the amplitude of the output voltage of the integrator is out of this range, the quantization noise is locally greatly mixed in the proximity of a maximum value or a minimum value of the input voltage. As a result, the SN ratio is deteriorated.

FIG. 19 illustrates the result of a function simulation of the system disclosed in the above referred publications. This is the result of the four-bit quantization in the one-order structure shown in FIG. 13 or FIG. 14. The full scale of the input voltage of the quantizer is −1V to +1V, but the amplitude of the output voltage of the integrator exceeds this range. Therefore, the digital output includes a distortion in portions corresponding the maximum value and the minimum value of the input voltage, with the result that the SN ratio is deteriorated. The SN ratio of 53 db is obtained, which is lower than 59 dB of the SN ratio obtained in the simulation in a multi-bit ΔΣ A/D converter of the first-order, four-bit quantization and four-bit feedback, under the same condition.

In order to avoid this problem, it is necessary either to restrict the amplitude of the analog input of the A/D converter or to add an analog multiplier to the integrator so as to attenuate the input by a gain coefficient "a" (0<a<1), thereby to suppress the amplitude of the output of the integrator. In the former manner, even if the amplitude of the output of the integrator can be suppressed within the full scale of the quantizer, the peak SN ratio becomes low by a suppressed portion of the signal amplitude. FIG. 20 illustrates a structure having an analog multiplier in the latter manner. The transfer function in this structure becomes the following expression (10):

$$Y(z)=\{aX(z)+(1-z^{-1})Qa(z)+(1-a)z^{-1}(1-z^{-1})Qd(z)\}/\{1+(a-1)z^{-1}\}(0)$$

From the expression (10), the smaller the value of "a" is, Qd(z) is leaked in. Accordingly, the SN ratio is remarkably deteriorated. FIG. 21 illustrates the result of the function simulation in the case that the coefficient of the analog multiplier 9a is "a"=0.5 in the first-order, four-bit quantization under the same condition mentioned above. It would be seen that, the amplitude of the integrator is suppressed within the input full scale of the quantizer, so that the quantization is normally carried out, and on the other hand, Qd(z) is leaked in the digital output after the digital processing has been carried out, a high frequency noise is mixed into. The SN ratio obtained under this situation is 47.6 dB.

As mentioned above, the system disclosed in the above referred publications has the following problems: First, since the one-bit feedback is adopted, the signal of the difference from the analog signal becomes large, so that the output amplitude of the integrator becomes large. It is necessary to suppress the output amplitude of the integrator within the input full scale of the quantizer, and therefore, the analog multiplier 9a becomes necessary. The coefficient "a" of the analog multiplier must be smaller than "1". At this time, the digital quantization noise Qd(z) to be removed is leaked into. Since Qd(z) is greatly larger than the quantization noise Qa mixed into with the quantizer, the SN ratio is greatly deteriorated.

BRIEF SUMMARY OF THE INVENTION

The present invention was made in consideration of the above mentioned matters. Accordingly, it is an object of the present invention to provide a new multi-bit ΔΣ A/D converter comprising a digital processing circuit capable of removing, without using an attenuation coefficient of an integrator, a digital quantization noise generated in a process in which an n-bit quantizer for outputting a digital value of a multi value is used, and a feedback is carried out through a one-bit D/A converter for outputting an binary analog value.

In order to achieve the above mentioned object, a first multi-bit ΔΣ A/D converter in accordance with the present invention comprises an analog adding means for outputting a difference between an analog input signal and an analog feedback signal, an analog integrating means for integrating an output signal of the analog adding means, an analog multiplying means for multiplying an output of the analog integrating means by a predetermined coefficient, a multi-bit quantizing means for quantizing an output of the analog multiplying means with a plurality of bits, and a D/A converting means for converting a digital output signal outputted from the multi-bit quantizing means into an analog signal, the D/A converting means outputting the analog signal as the analog feedback signal in a next sampling time, wherein there is provided a digital processing means receiving the digital output signal outputted from the multi-bit quantizing means, for outputting a sum of the digital output signal and a value obtained by multiplying the digital output signal outputted before a predetermined time, by a predetermined coefficient, and a value obtained by subtracting from an output of the digital processing means a value obtained by differentiating a predetermined quantization noise, is outputted.

The output Y(z) of the above mentioned multi-bit ΔΣ A/D converter is $$Y(z)=aX(z)+(1-z^{-1})Qa(z)$$

where X(z) is an analog input signal to the multi-bit ΔΣ A/D converter;
  a is a coefficient to be multiplied by the analog multiplying means;
  Qa(z) is a quantization noise mixed into with the multi-bit quantizing means.

The digital processing means includes a delay means for holding an output of the multi-bit quantizing means until a next sampling time, a digital multiplying means for multiplying an output of the delay means by a coefficient (a−1) and a first digital adding means for outputting a sum of the output of the multi-bit quantizing means and an output of the digital multiplying means.

A second multi-bit ΔΣ A/D converter in accordance with the present invention comprises "k" constitution stages (where "k" is a positive integer) connected in cascade, each of the constitution stages including an analog adding means receiving an analog input signal and an analog feedback signal for outputting a difference between the analog input signal and the analog feedback signal, an analog integrating means for integrating an output signal of the analog adding means, and an analog multiplying means for multiplying an output of the analog integrating means by a predetermined coefficient, a multi-bit quantizing means for quantizing an output of the analog multiplying means of the "k"th stage with a plurality of bits, and a D/A converting means for converting a digital output signal outputted from the multi-bit quantizing means into an analog signal, the D/A converting means outputting the analog signal to the analog adding means of the "k" stages, as the analog feedback signal in a next sampling time, wherein there is provided a digital processing means receiving the digital output signal outputted from the multi-bit quantizing means, for outputting a sum of the digital output signal and a value obtained by multiplying the digital output signal outputted before a predetermined time, by a predetermined coefficient, the digital processing means successively performing a similar adding processing for a result of the summing (k−1) times, and a value obtained by subtracting from an output of the digital processing means a value obtained by differentiating a predetermined quantization noise, is outputted.

The output Y(z) of the above mentioned multi-bit ΔΣ A/D converter is $$Y(z)=(a_1 a_2 \ldots a_k)X(z)+(1-z^{-1})^k Qa(z)$$

where X(z) is an analog input signal to the multi-bit ΔΣ A/D converter;
  $a_1, a_2, a_k$ are respective coefficients to be multiplied by the analog multiplying means of the first to (k)th stages;
  Qa(z) is a quantization noise mixed into with the multi-bit quantizing means.

When k=2, the digital processing means of the second multi-bit ΔΣ A/D converter includes a first delay means for holding an output of the multi-bit quantizing means until a next sampling time, a first digital multiplying means for multiplying an output of the first delay means by a coefficient $(a_1a_2+a_2-2)$, a first digital adding means for outputting a sum of the output of the multi-bit quantizing means and an output of the first digital multiplying means, a second delay means for holding an output of the first delay means until a further next sampling time, a second digital multiplying means for multiplying an output of the second delay means by a coefficient $(1-a_2)$, and a second digital adding means for outputting a sum of the output of the first digital adding means and an output of the second digital multiplying means, When k=3, and the digital processing means of the second multi-bit ΔΣ A/D converter includes a first delay means for holding an output of the multi-bit quantizing means until a next sampling time, a first digital multiplying means for multiplying an output of the first delay means by a coefficient $(a_1a_2a_3+a_2a_3+a_3-3)$, a first digital adding means for outputting a sum of the output of the multi-bit quantizing means and an output of the first digital multiplying means, a second delay means for holding an output of the first delay means until a next sampling time, a second digital multiplying means for multiplying an output of the second delay means by a coefficient $(3-a_2a_3-2a_3)$, a second digital adding means for outputting a sum of the output of the digital adding means and an output of the second digital multiplying means, a third delay means for holding an output of the second delay means until a next sampling time, a third digital multiplying means for multiplying an output of the third delay means by a coefficient $(a_3-1)$, and a third digital adding means for outputting a sum of the output of the second digital adding means and an output of the third digital multiplying means.

A third multi-bit ΔΣ A/D converter in accordance with the present invention comprises an analog adding means for outputting a difference between an analog input signal and an analog feedback signal, an analog integrating means for integrating an output signal of the analog adding means, an analog multiplying means for multiplying an output of the analog integrating means by a predetermined coefficient, a multi-bit quantizing means for quantizing an output of the analog multiplying means with a plurality of bits, and a D/A converting means for converting a digital output signal outputted from the multi-bit quantizing means into an analog signal, the D/A converting means outputting the analog signal as the analog feedback signal in a next sampling time, wherein the multi-bit quantizing means includes a n-bit quantizer (where "n" is an integer not less than 2) and a most significant bit extractor located at a stage following the n-bit quantizer.

wherein there is provided a digital processing means including a first delay means receiving an output of the n-bit quantizer, for holding the output of the n-bit quantizer for a predetermined time, a first digital multiplying means for multiplying an output of the first delay means by a predetermined coefficient, a first digital adding means for outputting a sum of the output of the n-bit quantizer and an output of the first digital multiplying means, a second delay means receiving a quantization noise mixed into with the most significant bit extractor, for holding the quantization noise for a predetermined time, a second digital multiplying means for multiplying an output of the second delay means by a predetermined coefficient, and a second digital adding means for outputting a sum of the output of the first digital adding means and an output of the second digital multiplying means, as an output of the multi-bit ΔΣ A/D converter.

The output Y(z) of the third multi-bit ΔΣ A/D converter is $$Y(z)=aX(z)+(1-z^{-1})Qa(z)$$

where X(z) is an analog input signal to the multi-bit ΔΣ A/D converter;

a is a coefficient to be multiplied by the analog multiplying means;

(a−1) is a coefficient to be multiplied by the first digital multiplying means;

a is a coefficient to be multiplied by the second digital multiplying means;

Qa(z) is a quantization noise mixed into with the n-bit quantizer.

A fourth multi-bit ΔΣ A/D converter in accordance with the present invention comprises two constitution stages connected in cascade, each of the constitution stages including an analog adding means for outputting a difference between an analog input signal and an analog feedback signal, an analog integrating means for integrating an output signal of the analog adding means, and an analog multiplying means for multiplying an output of the analog integrating means by a predetermined coefficient, a multi-bit quantizing means for quantizing an output of the analog multiplying means of the second stage with a plurality of bits, and a D/A converting means for converting a digital output signal outputted from the multi-bit quantizing means into an analog signal, the D/A converting means outputting the analog signal to the analog adding means of each stages, as the analog feedback signal in a next sampling time, wherein the multi-bit quantizing means includes a n-bit quantizer (where "n" is an integer not less than 2) and a most significant bit extractor located at a stage following the n-bit quantizer.

wherein there is provided a digital processing means including a first delay means receiving an output of the n-bit quantizer, for holding the output of the n-bit quantizer for a predetermined time, a first digital multiplying means for multiplying an output of the first delay means by a predetermined coefficient, a first digital adding means for outputting a sum of the output of the n-bit quantizer and an output of the first digital multiplying means, a second delay means for holding the output of the first delay means for a predetermined time, a second digital multiplying means for multiplying an output of the second delay means by a predetermined coefficient, a second digital adding means for outputting a sum of the output of the first digital adding means and an output of the second digital multiplying means, a third digital multiplying means receiving a quantization noise mixed into with the most significant bit extractor, for multiplying the quantization noise by a predetermined coefficient, a third delay means for holding an output of the third digital multiplying means for a predetermined time, a third digital adding means for outputting a sum of the output of the second digital adding means and an output of the third delay means, a fourth digital multiplying means for multiplying an output of the third delay means by a predetermined coefficient, a fourth digital adding means for outputting a sum of the third digital adding means and an output of the fourth digital multiplying means, a fourth delay means for holding an output of the third delay means for a predetermined time, and a fifth digital adding means for outputting a sum of the output of the fourth digital adding means and an output of the fourth delay means, as an output of the multi-bit ΔΣ A/D converter.

The output Y(z) of the fourth multi-bit ΔΣ A/D converter is $$Y(z)=a_1a_2X(z)+(1-z^{-1})^2Qa(z)$$

where X(z) is an analog input signal to the multi-bit ΔΣ A/D converter;

$a_1$ and $a_2$ are respective coefficients to be multiplied by the first and second analog multiplying means;

$(a_1a_2+a_2-2)$, $(1-a_1)$, $a_2$, and $a_1$ are respective coefficients to be multiplied by the first to fourth digital multiplying means;

Qa(z) is a quantization noise mixed into with the n-bit quantizer.

A fifth multi-bit ΔΣ A/D converter in accordance with the present invention comprises three constitution stages connected in cascade, each of the constitution stages including an analog adding means for outputting a difference between an analog input signal and an analog feedback signal, an analog integrating means for integrating an output signal of the analog adding means, and an analog multiplying means for multiplying an output of the analog integrating means by a predetermined coefficient, a multi-bit quantizing means for quantizing an output of the analog multiplying means of the final stage with a plurality of bits, and a D/A converting means for converting a digital output signal outputted from the multi-bit quantizing means into an analog signal, the D/A converting means outputting the analog signal to the analog adding means of each stages, as the analog feedback signal in a next sampling time, wherein the multi-bit quantizing means includes a n-bit quantizer (where "n" is an integer not less than 2) and a most significant bit extractor located at a stage following the n-bit quantizer.

wherein there is provided a digital processing means including a first delay means receiving an output of the n-bit quantizer, for holding the output of the n-bit quantizer for a predetermined time, a first digital multiplying means for multiplying an output of the first delay means by a predetermined coefficient, a first digital adding means for outputting a sum of the output of the n-bit quantizer and an output of the first digital multiplying means, a second delay means for holding the output of the first delay means for a predetermined time, a second digital multiplying means for multiplying an output of the second delay means by a predetermined coefficient, a second digital adding means for outputting a sum of the output of the first digital adding means and an output of the second digital multiplying means, a third delay means for holding the output of the second delay means for a predetermined time, a third digital multiplying means for multiplying an output of the third delay means by a predetermined coefficient, a third digital adding means for outputting a sum of the output of the second digital adding means and an output of the third digital multiplying means, a fourth digital multiplying means receiving a quantization noise mixed into with the most significant bit extractor, for multiplying the quantization noise by a predetermined coefficient, a fourth delay means for holding an output of the fourth digital multiplying means for a predetermined time, a fifth digital adding means for multiplying an output of the fourth delay means by a predetermined coefficient, a fourth digital adding means for outputting a sum of the output of the third digital adding means and an output of the fifth digital adding means, a fifth delay means for holding an output of the fourth delay means for a predetermined time, a sixth digital multiplying means for multiplying an output of the fifth delay means by a predetermined coefficient, a fifth digital adding means for outputting a sum of the fourth digital adding means and an output of the fifth digital multiplying means, a sixth delay means for holding an output of the fifth delay means for a predetermined time, and a sixth digital adding means for outputting a sum of the output of the fifth digital adding means and an output of the sixth delay means, as an output of the multi-bit ΔΣ A/D converter.

The output Y(z) of the fifth multi-bit ΔΣ A/D converter is $$Y(z)=a_1a_2a_3X(z)+(1-z^{-1})^3Qa(z)$$

where X(z) is an analog input signal to the multi-bit ΔΣ A/D converter;

$a_1$, $a_2$ and $a_3$ are respective coefficients to be multiplied by the first to third analog multiplying means;

$(a_1a_2a_3+a_2a_3+a_3-3)$, $(3-a_2a_3-2a_3)$, $(a_3-1)$, $a_3$, $(a_1a_2+a_2+1)$, $(a_2+2)$ are respective coefficients to be multiplied by the first to sixth digital multiplying means;

Qa(z) is a quantization noise mixed into with the n-bit quantizer.

With the multi-bit ΔΣ A/D converters having the above mentioned structure, a quantization noise in a signal band is minimized, and a high precision of conversion can be obtained with a low oversampling ratio.

BRIEF DESCRIPTION OF THE DRAWINGS

FIG. 21 is a waveform diagram of various parts obtained in a function simulation in the case that a four-bit quantization is carried out in the structure shown in FIG. 20.

DETAILED DESCRIPTION OF THE INVENTION

Now, embodiments of the present invention will be described with reference to the drawings.

Figure 1:
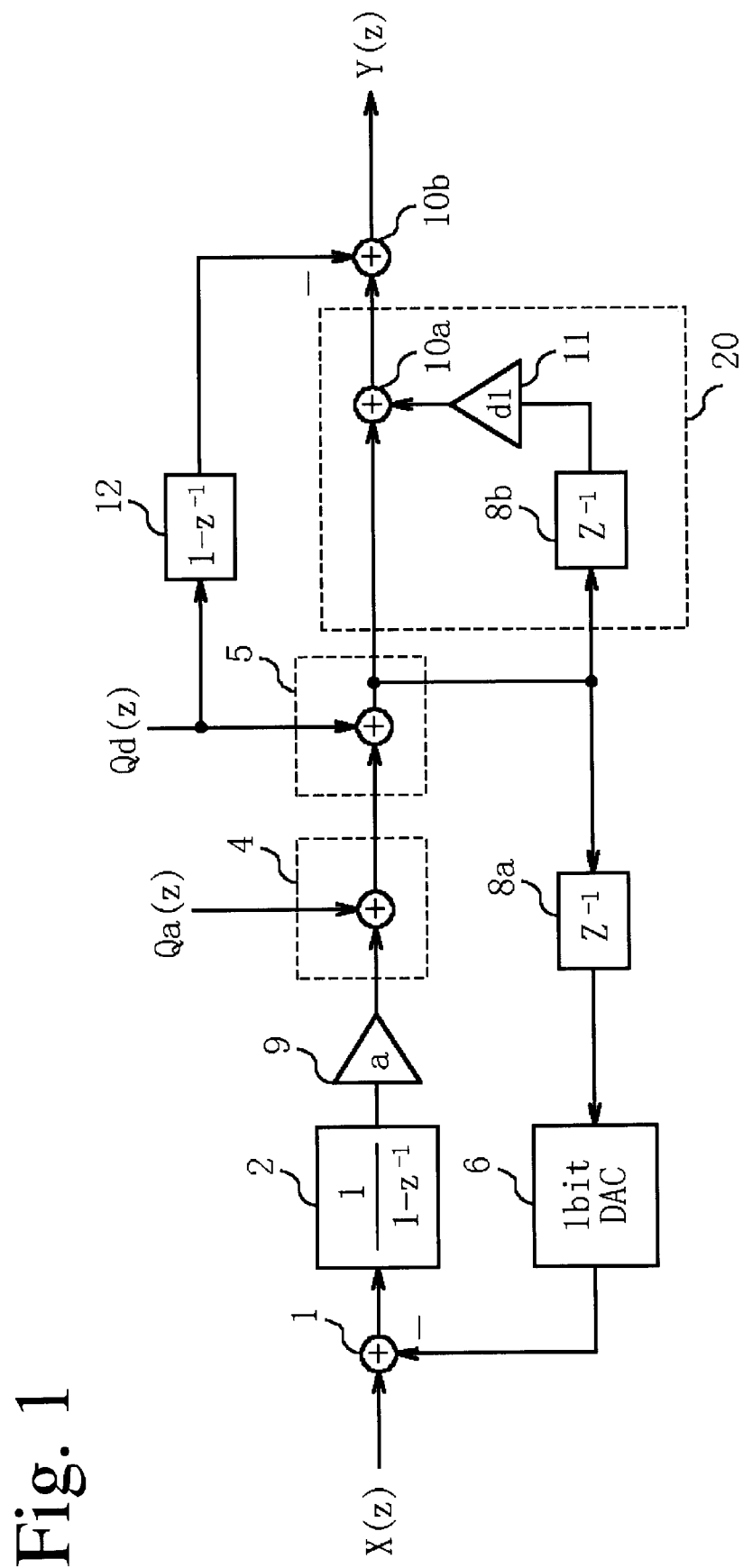
FIG. 1 is a block diagram of a first embodiment of the multi-bit ΔΣ A/D converter in accordance with the present invention.

FIG. 1 is a block diagram illustrating the structure of a first embodiment of the multi-bit ΔΣ A/D converter in accordance with the present invention.

In this multi-bit ΔΣ A/D converter, an analog input signal is supplied to an analog adder 1, which outputs a difference between the analog input signal and an output of a one-bit D/A converter 6. The output of the analog adder 1 is connected to an analog integrator 2 for integrating the output of the analog adder 1. To an output of the analog integrator 2, an analog multiplier 9, a n-bit quantizer 4 (where "n" is an integer not less than 2), a most significant bit extractor 5 are connected in cascade. The analog multiplier 9 multiplies the output of the analog integrator 2 by an arbitrary constant "a", and the n-bit quantizer 4 quantizes an output of the analog multiplier 9 by n bits. The most significant bit extractor 5 outputs only the most significant bit of an output of the n-bit quantizer 4. An output of the most significant bit extractor 5 is supplied to delays 8a and 8b and a digital adder 10a. The delay 8a holds the output of the most significant bit extractor 5 until a next sampling time. An output of the delay 8s is supplied to the one-bit D/A converter 6. A digital processing part 20 is constituted of the delay 8b and the digital adder 10a and a digital multiplier 11 located therebetween. The delay 8b holds the output of the most significant bit extractor 5 until the next sampling time. The digital multiplier 11 multiplies an output signal of the delay 8b by a coefficient d1 (d1=a−1). The digital adder 10a adds the output of the most significant bit extractor 5 and an output of the digital multiplier 11. An output of the digital adder 10a constitutes an output of the digital processing part 20. A digital differentiator 12 differentiates a difference (corresponding to Qd) between the output of the most significant bit extractor 5 and the output of the n-bit quantizer 4. A digital adder 10b obtains a difference between the output of the digital processing part 20 and an output of the digital differentiator 12, and outputs the obtained difference.

Next, an operation of the multi-bit ΔΣ A/D converter shown in FIG. 1 will be described. The analog adder 1 obtains the difference between the analog input signal X(z) and the output of a one-bit D/A converter 6. This difference signal is integrated by the analog integrator 2, and the analog multiplier 9 multiplies the output of the analog integrator 2 by an arbitrary constant "a" so that an amplitude of the output of the analog integrator 2 is within a full scale of the n-bit quantizer 4. The n-bit quantizer 4 quantizes the output of the analog multiplier 9 into a digital value having $2^n$ values, and the most significant bit extractor 5 outputs only the most significant bit of the output of the n-bit quantizer 4. The output of the most significant bit extractor 5 becomes an input signal to the one-bit D/A converter 6 provided in a feedback part. The one-bit D/A converter 6 converts the most significant bit of one bit outputted from the most significant bit extractor 5, into a binary analog value. Here, assuming that a quantization noise mixed into with the n-bit quantizer 4 is Qa(z) and a quantization noise mixed into with the most significant bit extractor 5 is Qd(z), a transfer function becomes the following expression (11):

$$\{1+(a-1)z^{-1}\}Y1(z)=aX(z)+(1-z^{-1})Qa(z)+(1-z^{-1})Qd(z) \qquad (11)$$

A left side of the expression (11) is arithmetically processed by the digital processing part 20. In this digital processing part 20, the output signal Y1(z) of the most significant bit extractor 5 is added with a value obtained by multiplying the output signal Y1(z) before one sampling time, by (a−1). Namely, assuming that the output of the digital processing part 20 is Y2(z), a tranfer function of the digital processing part 20 becomes the following expression (12):

$$Y2(z)=\{1+(a-1)z^{-1}\}Y1(z) \qquad (12)$$

From the expressions (11) and (12), the output Y2(z) of the digital processing part 20 becomes the following expression (13):

$$Y2(z)=aX(z)+(1-z^{-1})Qa(z)+(1-z^{-1})Qd(z) \qquad (13)$$

Here, the quantization noise Qd(z) mixed into with the most significant bit extractor 5 is extracted, and differentiated by the digital differentiator 12. Assuming that the output of the digital differentiator 12 is Y3(z), a transfer function of the digital differentiator 12 becomes the following expression (14):

$$Y3(z)=(1-z^{-1})Qd(z) \qquad (14)$$

Finally, if the digital adder 10b obtains the difference between the output signal Y2(z) of the digital processing part 20 and the output signal Y3(z) of the digital differentiator 12, the output Y(z) of the digital adder 10b becomes the following expression (15):

$$Y(z) = Y2(z) - Y3(z)$$

$$= aX(z) + (1-z^{-1})Qa(z) \qquad (15)$$

From the expression (15), the quantization noise Qa(z) mixed into with the n-bit quantizer 4 is subjected to a first-order noise shaping. The digital quantization noise Qd(z) mixed into with the most significant bit extractor 5 is completely removed regardless of the value of "a". In addition, since Qa(z) is far smaller than Qd(z), improvement in the precision of conversion obtained by the complete removal of Qd(z) is very high. Furthermore, the higher the resolution of the n-bit quantizer 4 is, Qa(z) becomes small, with the result that further improvement in the precision of conversion is possible.

Figure 2:
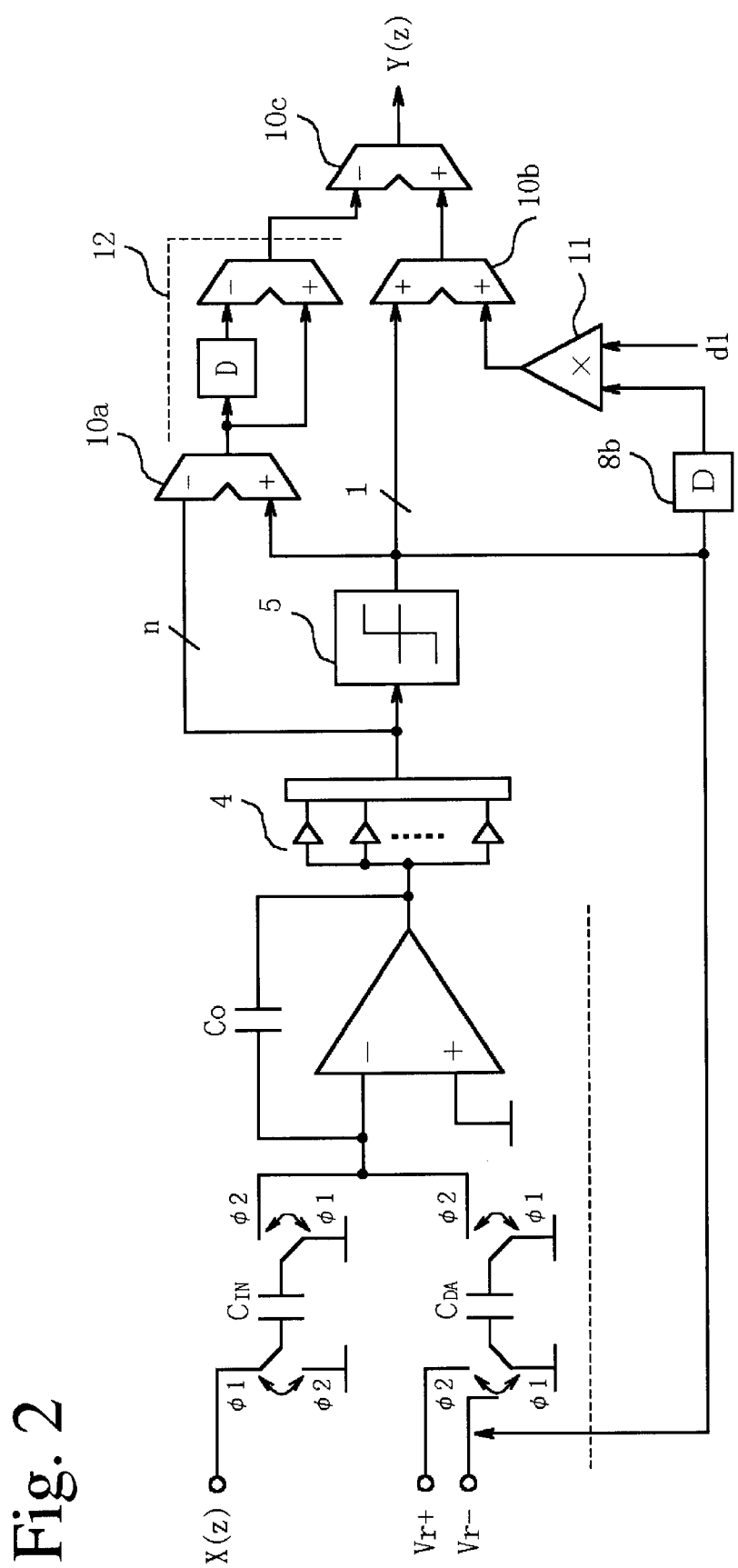
FIG. 2 is a circuit diagram realizing the first embodiment.

FIG. 2 is a circuit diagram realizing the block diagram shown in FIG. 1. In general, the ΔΣ A/D converter is realized by a switched capacitor circuit (called a "SC circuit" hereinafter). With the SC circuit, it is possible to simultaneously realize the analog adder 1, the analog integrator 2, the analog multiplier and the one-bit D/A converter 6. The analog adder 1 can be realized by polarity-inverting an electric charge charged in a capacitor Cin and an electric charge stored in a capacitor Cda to each other. A sum (differential signal) of the electric charges stored in both the capacitors is charged into a capacitor Co thereby to realize an integration. In addition, the arbitrary constant "a" of the analog multiplier 9 is given by the following expression (16):

$$a = Cin/Co \qquad (16)$$

For the n-bit quantizer 4, a thermometer-type quantizer is constituted of a plurality of comparators located in parallel so that an input voltage is compared with a plurality of reference voltages. The most significant bit extractor 5 outputs only the most significant bit or a sign bit. Here, a difference (=Qd) between the most significant bit and the n-bit output of the n-bit quantizer 4 is obtained by the digital adder 10a. On the basis of the data of the most significant bit, a reference voltage for the one-bit D/A converter 6 is selected. The delays used in the digital processing part 20 and the digital differentiator 12 can be realized of a DFF circuit. The digital multiplier 11 can be realized only by outputting the coefficient value based on the data of the data of the most significant bit, since the data of one bit is multiplied by a constant number. In addition, if "a" is expressed by the power of 2, it is sufficient only if the data is shifted by using a shift register. It is sufficient if the digital adders 10b and 10c are an adder of (n+2)bits.

Figure 3:
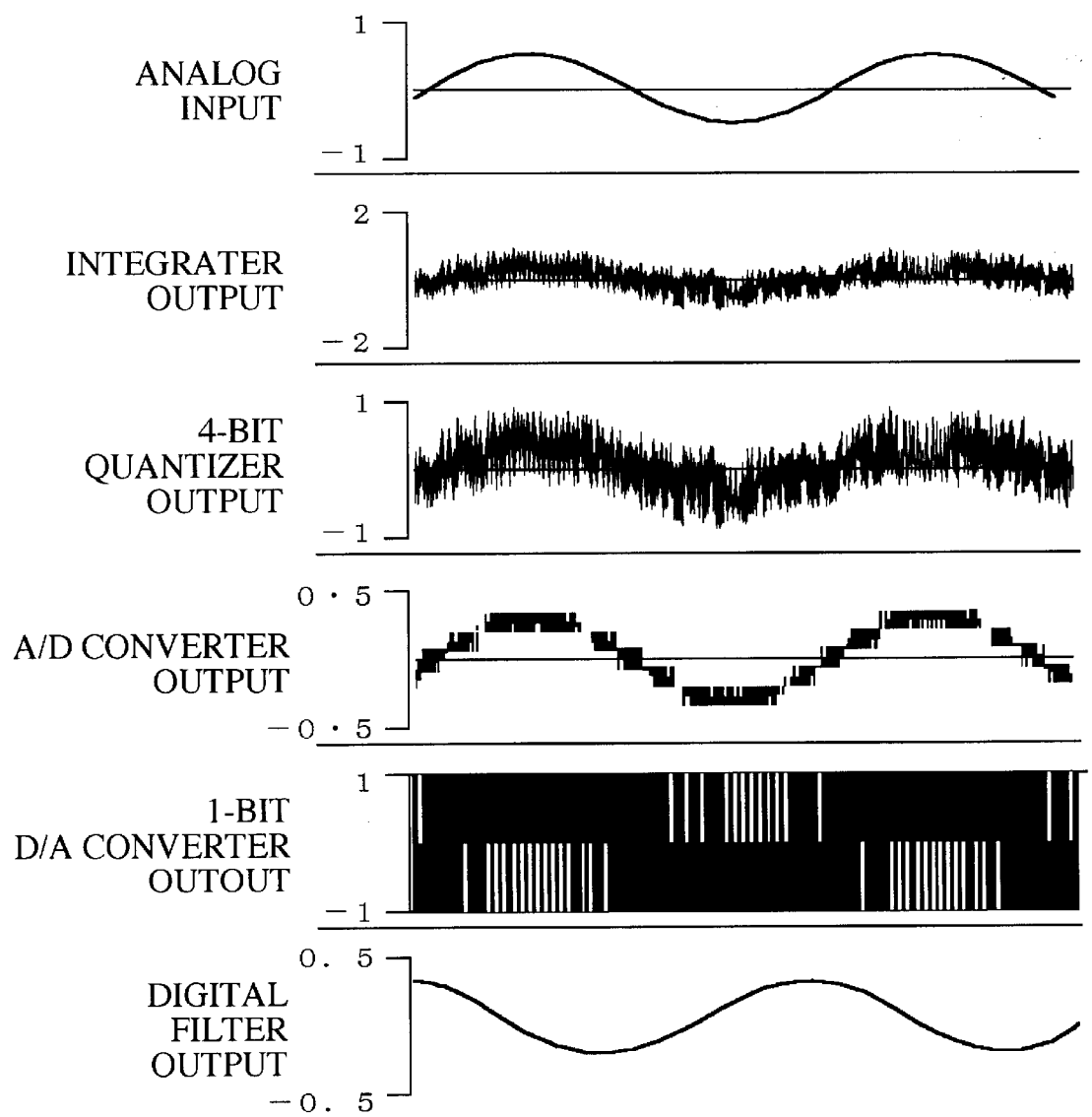
FIG. 3 is a waveform diagram of various parts obtained in a function simulation of the first embodiment.
Figure 19:
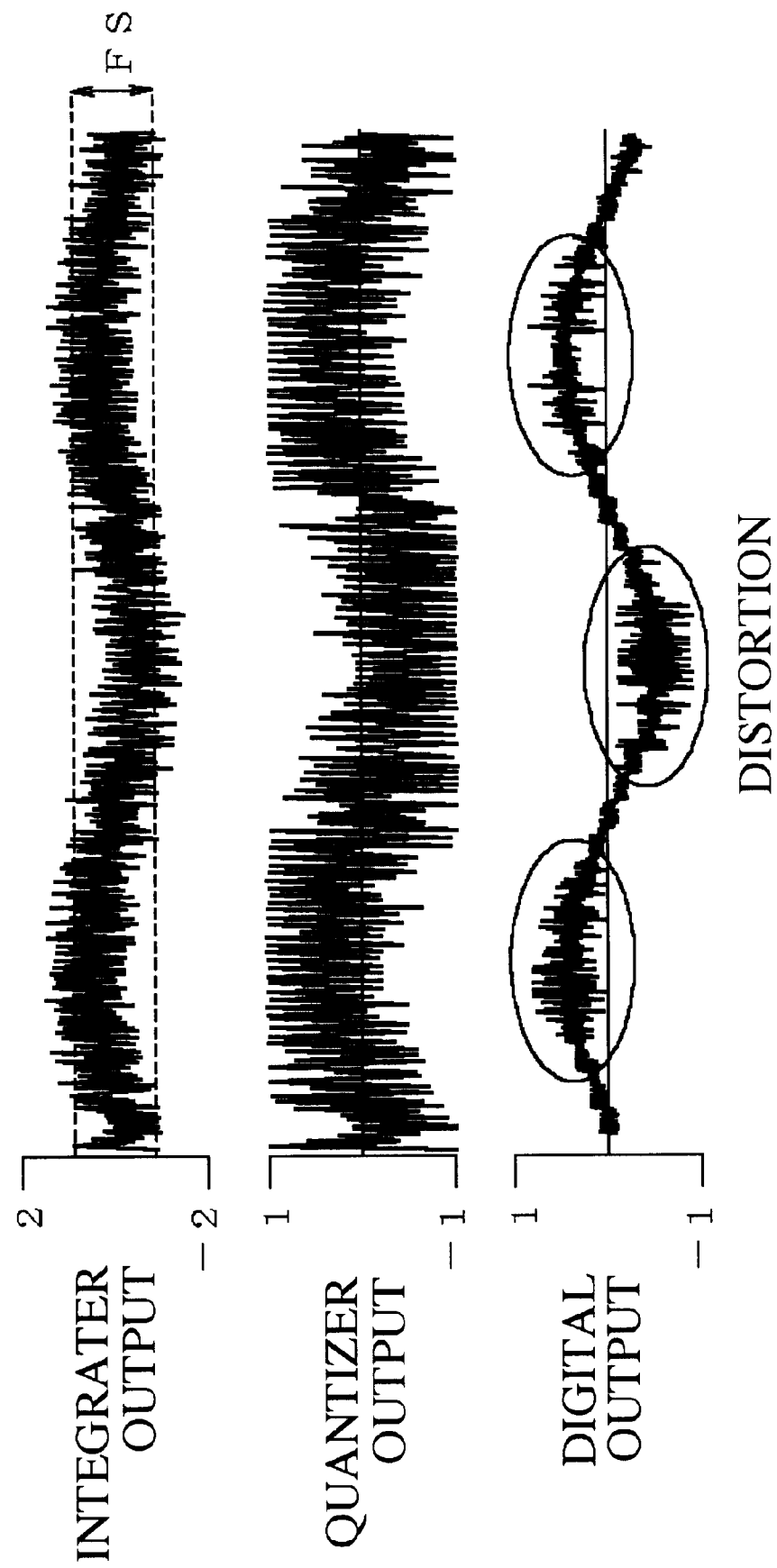
FIG. 19 is a waveform diagram of various parts obtained in a function simulation in the case that a four-bit quantization is carried out in the structure shown in FIG. 13.
Figure 20:
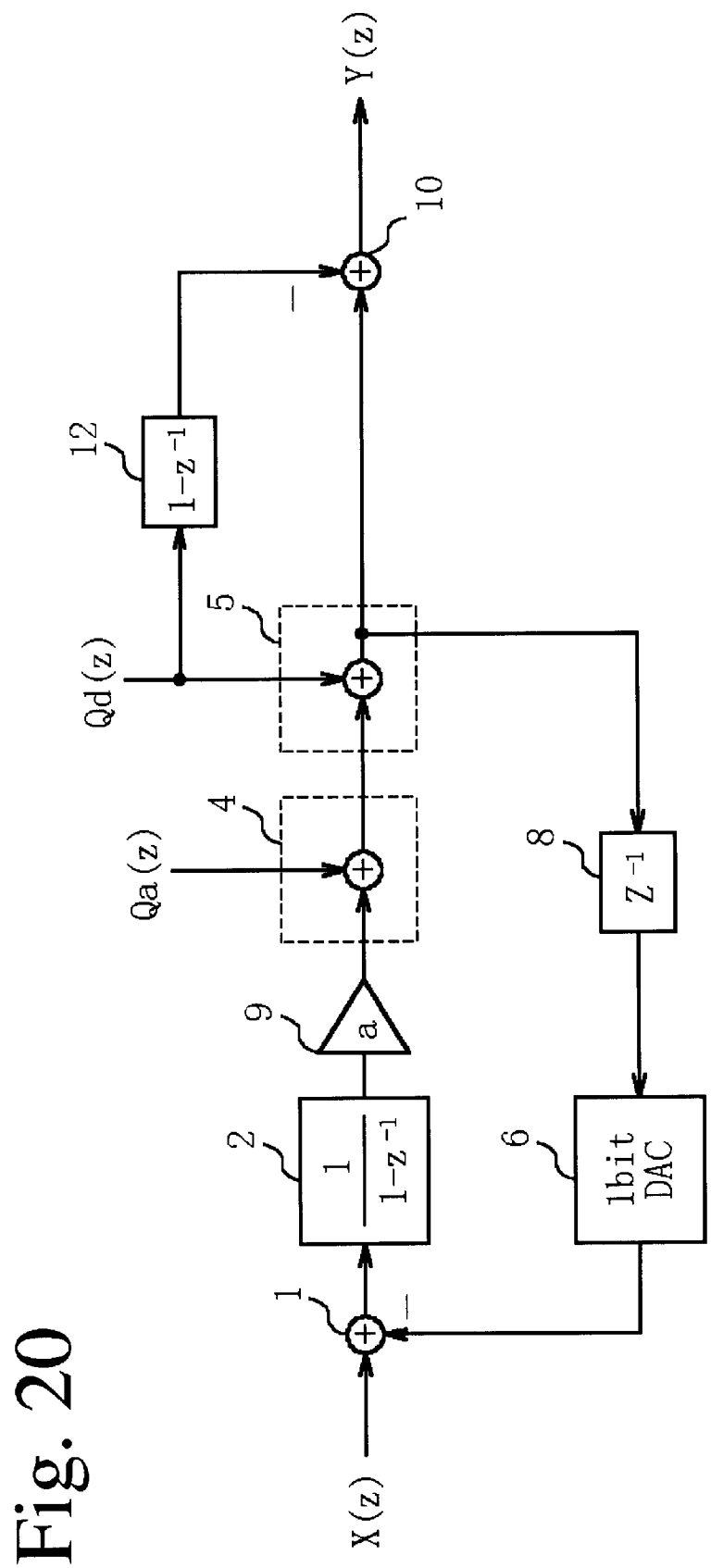
FIG. 20 is a block diagram illustrating a structure in which an analog multiplier for attenuating the output of the analog integrator is inserted in the structure shown in FIG. 14.

FIG. 3 is a waveform diagram of various parts obtained in a function simulation of the structure of the present invention shown in FIG. 1. The simulation is that an oversampling ratio is 32 times, a four-bit quantization is carried out, and a=0.5. In the waveform of the AD converter shown in FIG. 3, it would be seen that there is neither the distortion nor the leakage of Qd, which are shown in FIG. 19 and FIG. 21.

Figure 4:
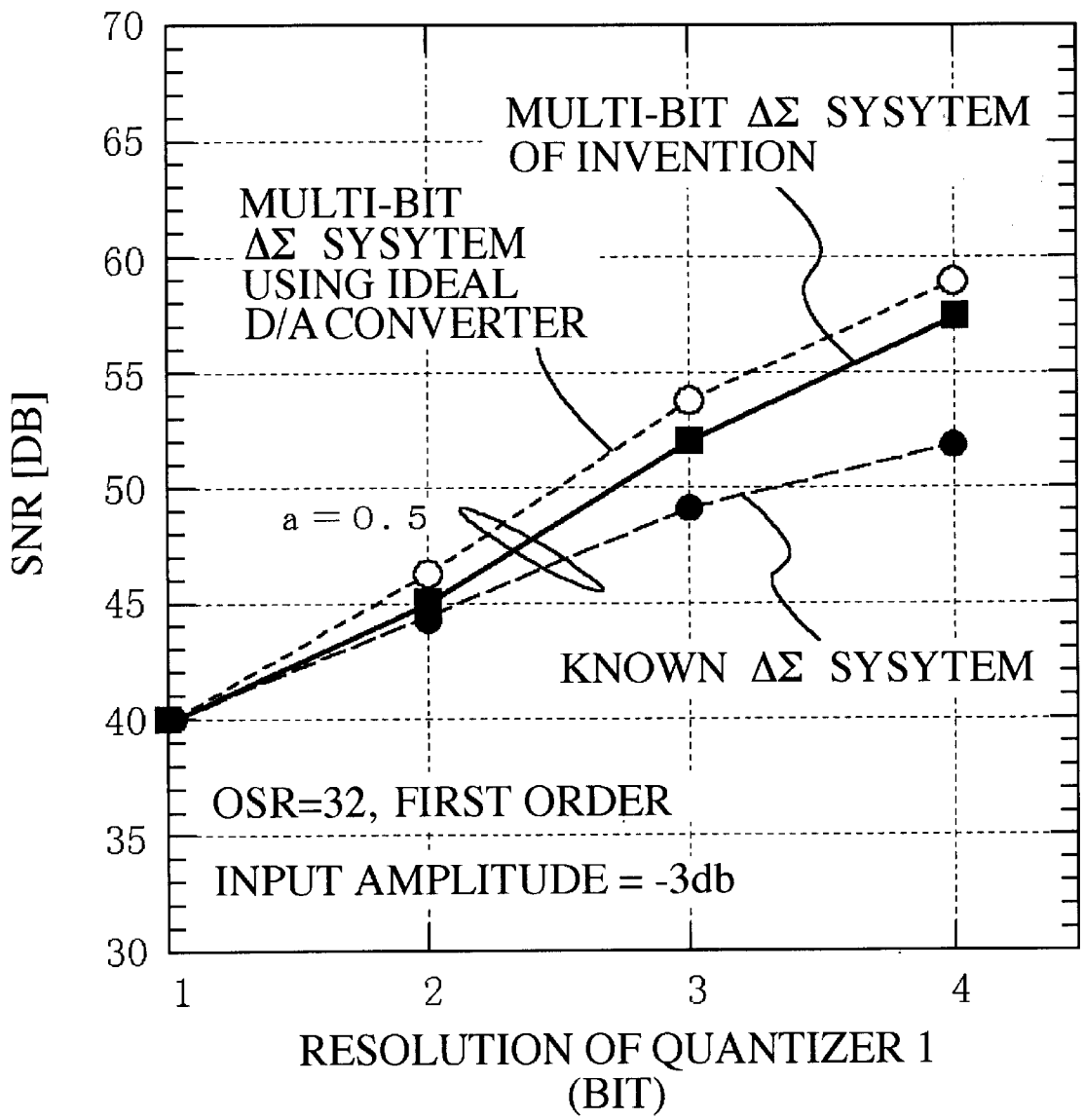
FIG. 4 is a SN characteristics diagram obtained in the function simulation of the first embodiment.

FIG. 4 is a SN characteristics diagram obtained in the function simulation of the structure of the present invention shown in FIG. 1. The axis of abscissas indicates the resolution of the quantizer, and the axis of ordinates shows the SN ratio. The simulation is that an oversampling ratio is 32 times, and a=0.5. It would be seen that the precision of conversion is higher than that obtained in the structure disclosed in the above referred publications, and the SN ratio is obtained which is comparable to that obtained in a conventional $\Delta\Sigma$ A/D converter assumed to use an ideal multi-bit D/A converter.

Figure 5:
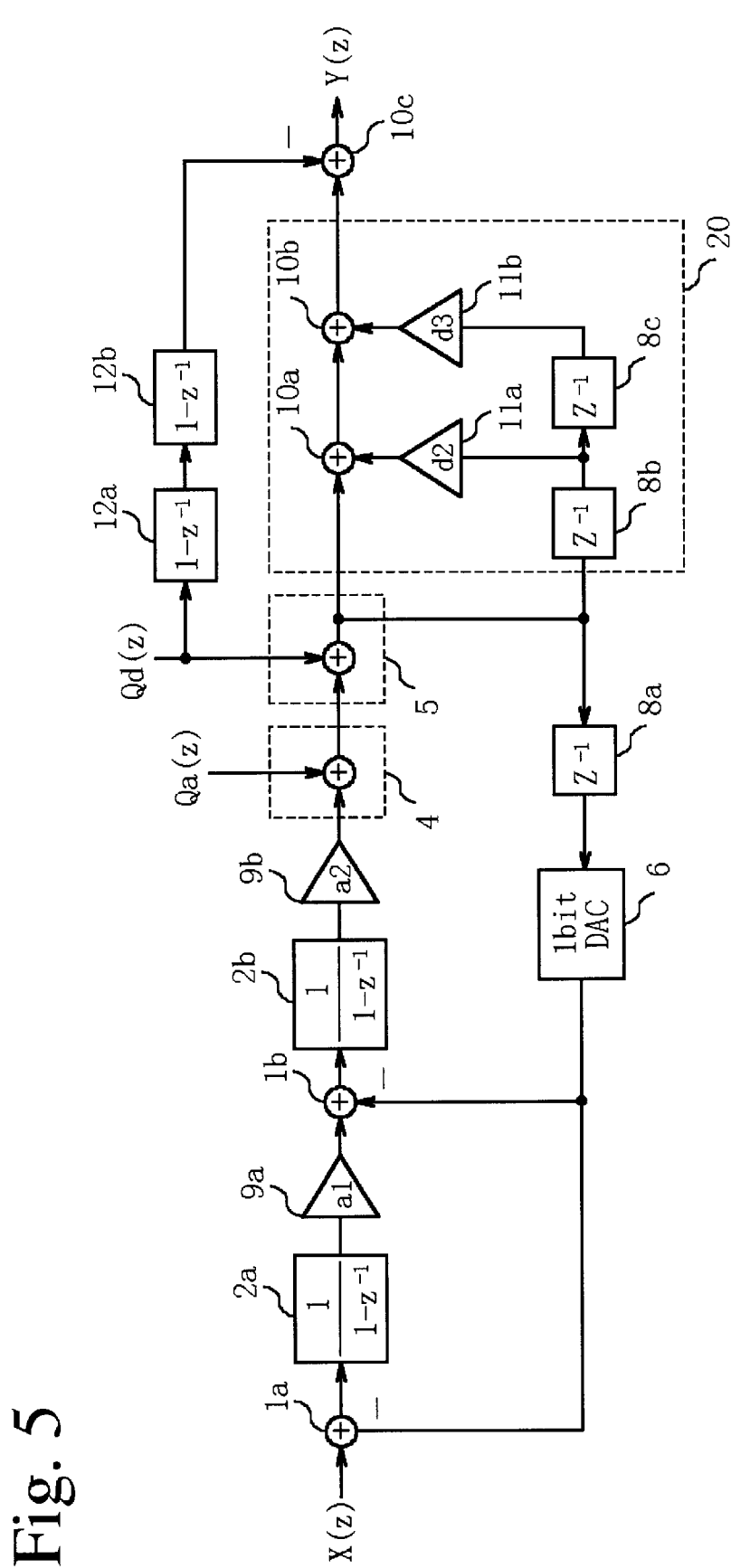
FIG. 5 is a block diagram of a second embodiment of the multi-bit ΔΣ A/D converter in accordance with the present invention.

FIG. 5 is a block diagram of a second embodiment of the multi-bit $\Delta\Sigma$ A/D converter in accordance with the present invention This embodiment realizes a second-order noise shaping for the quantization noise Qa(z) mixed into with the n-bit quantizer. This multi-bit $\Delta\Sigma$ A/D converter includes an analog adder 1a for receiving an input signal X(z), an analog integrator 2a, and an analog multiplier 9a, which are connected in cascade as shown in FIG. 5. Succeedingly, similarly, an analog adder 1b, an analog integrator 2b, and an analog multiplier 9b are also connected in cascade. Following, a n-bit quantizer 4 and a most significant bit extractor 5 are further connected in cascade. In this embodiment, an output of the most significant bit extractor 5 is held by a delay 8a until a next sampling time, and an output of the delay 8a is supplied through a one-bit D/A converter 6 to the analog adders 1a and 1b. Following the most significant bit extractor 5, a digital processing part 20 is located. The digital processing part 20 includes a delay 8b for receiving the output of the most significant bit extractor 5, a digital adder 10a and a digital multiplier 11a located between the delay 8b and the digital adder 10a. The digital processing part 20 further includes a delay 8c, a digital adder 10b and a digital multiplier 11b located in a similar manner. In addition, a digital adder 10c is provided which outputs a difference between an output of the digital processing part 20 and an output of digital differentiators 12a and 12b.

A quantization noise Qa(z) is mixed into with the n-bit quantizer 4 and a quantization noise Qd(z) is mixed into with the most significant bit extractor 5. These two quantization noises are subjected to a second-order noise shaping by action of the two integrators. Assuming that an output of the most significant bit extractor 5 is Y1(z), a transfer function becomes the following expression (17):

$$\{1+(a_1a_2+a_2-2)z^{-1}+(1-a_2)z^{-2}\}Y1(z) = a_1a_2X(z)+(1-z^{-1})^2Qa(z)+(1-z^{-1})^2Qd(z) \qquad (17)$$

Assuming that $d2=a_1a_2+a_2-2$ and $d3=1-a_2$, the expression (17) can be expressed as follows:

$$\{1+d2\ z^{-1}+d3\ z^{-2}\}Y1(z)=a_1a_2X(z)+(1-z^{-1})^2Qa(z)+(1-z^{-1})^2Qd(z) \qquad (18)$$

A left side of the expression (18) is arithmetically processed by the digital processing part 20. In this digital processing part 20, namely, the output signal Y1(z) of the most significant bit extractor 5 is added with a total of a value obtained by multiplying the output signal Y1(z) before one sampling time, by d2, and another value obtained by multiplying the output signal Y1(z) before two sampling times, by d3. Namely, assuming that the output of the digital processing part 20 is Y2(z), a tranfer function becomes the following expression (19):

$$Y2(z)=a_1a_2X(z)+(1-z^{-1})^2Qa(z)+(1-z^{-1})^2Qd(z) \qquad (19)$$

Here, the quantization noise Qd(z) mixed into with the most significant bit extractor 5 is successively differentiated in a second order by the two digital differentiators 12a and 12b, and the output Y2(z) becomes the following expression (20):

$$Y3(z)=(1-z^{-1})^2Qd(z) \qquad (20)$$

Finally, if the digital adder 10c obtains the difference between the output signal Y2(z) and the output signal Y3(z), the output Y(z) is obtained. From the expressions (19) and (20), the transfer function in the output Y(z) becomes the following expression (21):

$$Y(z)=a_1a_2X(z)+(1-z^{-1})^2Qa(z) \qquad (21)$$

From the expression (21), the quantization noise Qa(z) is completely removed by action of the digital processing part 20 and the digital differentiators 12a and 12b, which are additionally provided. In addition, since Qa(z), which is far smaller than Qd(z), can be obtained by the second-order noise shaping, so that the precision of conversion higher than that obtained by the structure shown in FIG. 1 can be obtained.

Figure 6:
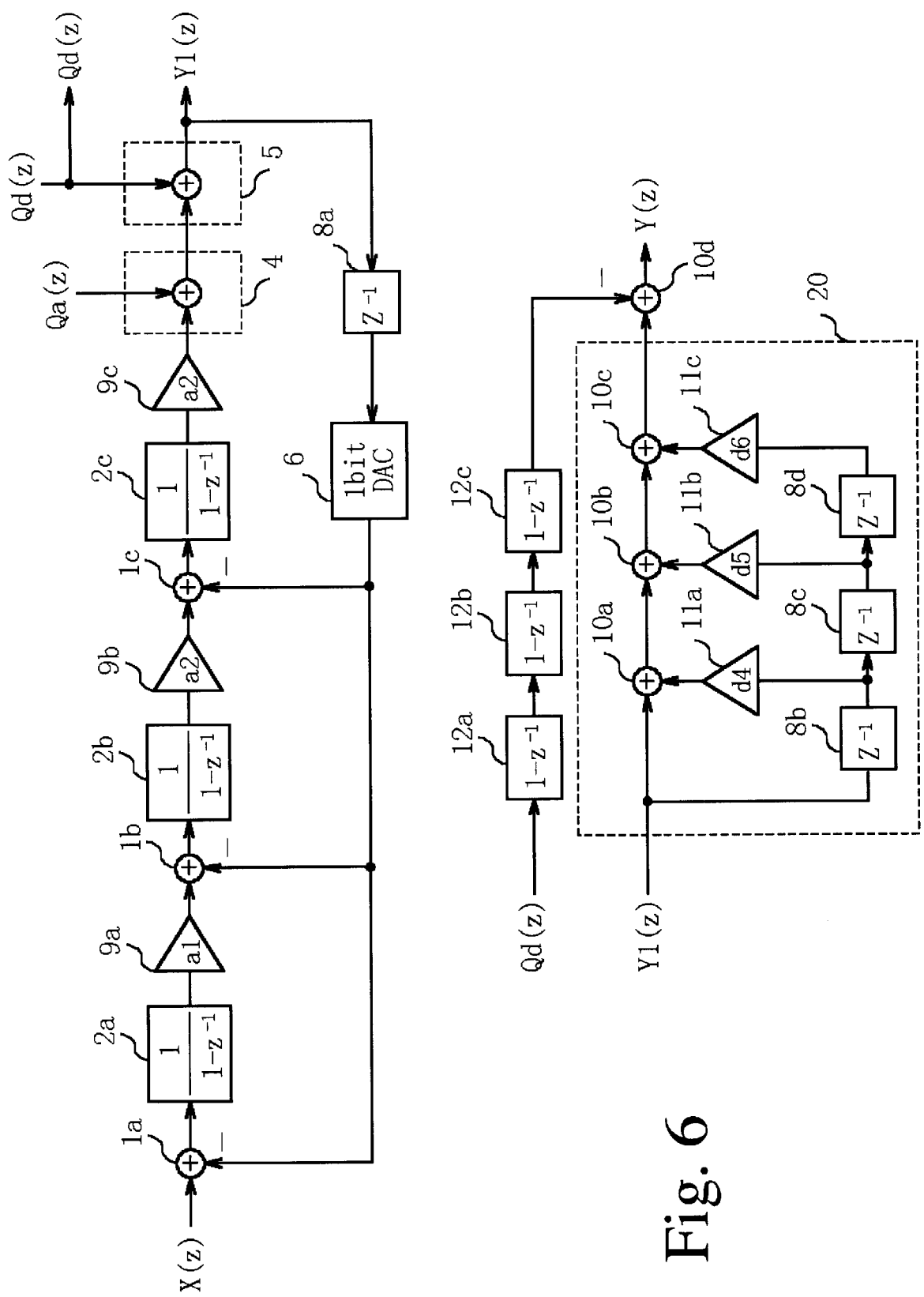
FIG. 6 is a block diagram of a third embodiment of the multi-bit ΔΣ A/D converter in accordance with the present invention.

FIG. 6 is a block diagram of a third embodiment of the multi-bit $\Delta\Sigma$ A/D converter in accordance with the present invention. This multi-bit $\Delta\Sigma$ A/D converter realizes a third-order noise shaping for the quantization noise Qa(z) mixed into with the n-bit quantizer. Specifically, following the analog adder 1b, the analog integrator 2b and the analog multiplier 9b connected in cascade in the A/D converter shown in FIG. 5, an analog adder 1c, an analog integrator 2c, and an analog multiplier 9c are further connected in cascade. An output of the one-bit D/A converter 6 is also supplied to the analog adder 1c. Similarly, a digital differentiator 12c is located to follow the digital differentiators 12a and 12b. The digital processing part 20 further includes a delay 8d, a digital multiplier 11c and a digital adder 10c, which are located in a similar manner.

A quantization noise Qa(z) is mixed into with the n-bit quantizer 4 and a quantization noise Qd(z) is mixed into with the most significant bit extractor 5. These two quantization noises are subjected to a third-order noise shaping by action of the three integrators. Assuming that an output of the most significant bit extractor 5 is Y1(z), a transfer function becomes the following expression (22):

$$\{1+(a_1a_2a_3+a_2a_3+a_3-3)z$$
$$-1+(3-a_2a_3-2a_3)z^{-2}+$$
$$(a_3-1)z^{-3}\}Y1(z)=a_1a_2a_3X(z)+$$
$$(1-z^{-1})^3Qa(z)+(1-z^{-1})^3Qd(z) \qquad (22)$$

Assuming that $d4=a_1a_2a_3+a_2a_3+a_3-3$, $d5=3-a_2a_3-2a_3$ and $d6=a_3-1$, the expression (22) can be expressed as follows:

$$\{1+d4\ z^{-1}+d5\ z^{-2}+d6\ z^{-3}\}Y1(z)=a_1a_2a_3X(z)+(1-z^{-1})^3Qa(z)+(1-z^{-1})^3Qd(z) \qquad (23)$$

A left side of the expression (23) is arithmetically processed by the digital processing part 20. In this digital processing part 20, namely, the output signal Y1(z) of the most significant bit extractor 5 is added with a total of a first value obtained by multiplying the output signal Y1(z) before one sampling time, by d4, a second value obtained by multiplying the output signal Y1(z) before two sampling times, by d5, and a third value obtained by multiplying the output signal Y1(z) before three sampling times, by d6. Assuming that the output of the digital processing part 20 is Y2(z), a tranfer function becomes the following expression (24):

$$Y2(z)=a_1a_2a_3X(z)+(1-z^{-1})^3Qa(z)+(1-z^{-1})^3Qd(z) \qquad (24)$$

Here, the quantization noise Qd(z) mixed into with the most significant bit extractor 5 is successively differentiated in a third order by the three digital differentiators, and the output Y2(z) becomes the following expression (25):

$$Y3(z)=(1-z^{-1})^3Qd(z) \qquad (25)$$

Finally, if a digital adder 10d obtains the difference between the output signal Y2(z) and the output signal Y3(z), the output Y(z) is obtained. From the expressions (24) and (25), the transfer function in the output Y(z) becomes the following expression (26):

$$Y(z)=a_1a_2a_3X(z)+(1-z^{-1})^3Qa(z) \qquad (26)$$

From the expression (26), the quantization noise Qa(z) is completely removed by action of the digital processing part 20 and the digital differentiators, which are additionally provided. In addition, since Qa(z), which is far smaller than Qd(z), can be obtained by the third-order noise shaping, so that the precision of conversion higher than that obtained in the above mentioned second embodiment can be obtained.

As seen from the above description in connection with FIG. 1, FIG. 5 and FIG. 6, if "k" sets of an analog adder means, an analog integrator means and an analog multiplier means which are connected in cascade, are coupled in cascade, and if the digital processing part is constituted by cascading "k" basic structures similar to the basic structure shown in FIG. 1, so that the noise shaping of a "k"-order is carried out, it would be apparent that the digital output Y(z) becomes the following expression (27):

$$Y(z)=(a_1a_2a_3\ldots a_k)X(z)+(1-z^{-1})^kQa(z) \qquad (27)$$

Figure 7:
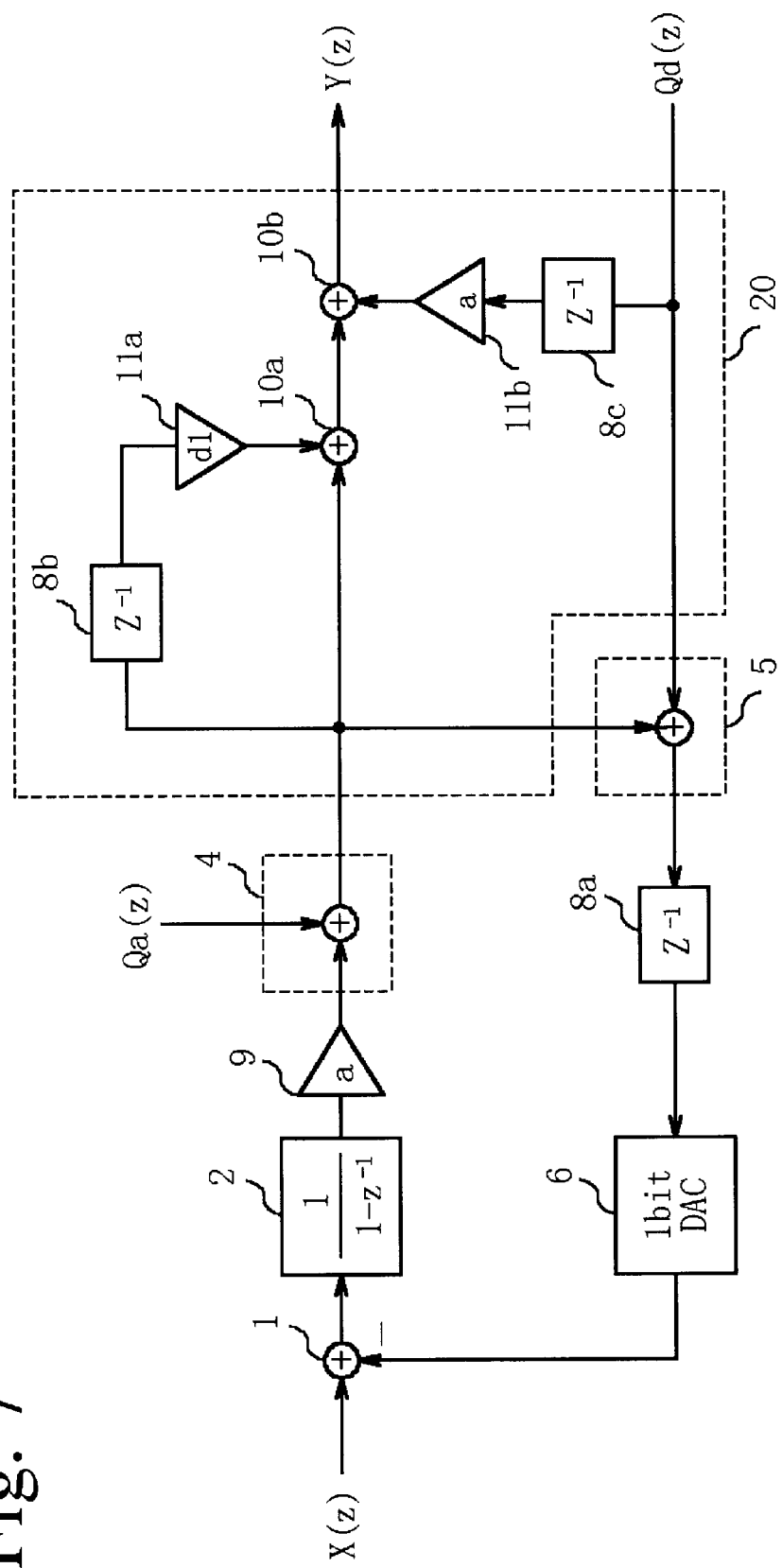
FIG. 7 is a block diagram of a fourth embodiment of the multi-bit ΔΣ A/D converter in accordance with the present invention.

FIG. 7 is a block diagram of a fourth embodiment of the multi-bit ΔΣ A/D converter in accordance with the present invention. In this A/D converter, similarly to the structure shown in FIG. 1, an analog input signal is supplied to an analog adder 1, which outputs a difference between the analog input signal and an output of a one-bit D/A converter 6. The output of the analog adder 1 is connected to an analog integrator 2 for integrating the output of the analog adder 1. To an output of the analog integrator 2, an analog multiplier 9, a n-bit quantizer 4, a most significant bit extractor 5 are connected in cascade. The analog multiplier 9 multiplies the output of the analog integrator 2 by an arbitrary constant "a", and the n-bit quantizer 4 quantizes an output of the analog multiplier 9 by n bits. The most significant bit extractor 5 outputs only the most significant bit of an output of the n-bit quantizer 4. This embodiment comprises a digital processing part 20 receiving an output Y1(z) of the n-bit quantizer 4. In this digital processing part 20, Y1(z) is held by a delay 8b until a next sampling time, and is multiplied with a coefficient d1 (d1=a−1) by action of a digital multiplier 11a. The digital adder 10a outputs a sum of Y1(z) and an output of the digital multiplier 11a. Furthermore, the quantization noise Qd(z) mixed into with the most significant bit extractor 5 is extracted, and is held by a delay 8c until a further next sampling time, and furthermore, is multiplied with "a" by action of a digital multiplier 11b. A digital adder 10b outputs a sum of the output of the digital adder 10a and an output of the digital multiplier 11b. This is an output of the digital processing part 20 and an output of this A/D converter, Here, a transfer function in Y1(z) becomes the following expression (28):

$$\{1+d1z^{-1}\}Y1(z)=aX(z)+(1-z^{-1})Qa(z)-az^{-1}Qd(z) \qquad (28)$$

A tranfer function of the digital processing part becomes the following expression (29):

$$Y2(z)=\{1+d1z^{-1}\}Y1(z)+az^{-1}Qd(z) \qquad (29)$$

From the expressions (28) and (29), the output Y(z) of the A/D converter becomes the following expression (30):

$$Y(z)=aX(z)+(1-z^{-1})Qa(z) \qquad (30)$$

The expression (30) is completely the same as the expression (15), and therefore, the structure shown in FIG. 7 becomes the similarity of the first embodiment.

Figure 8:
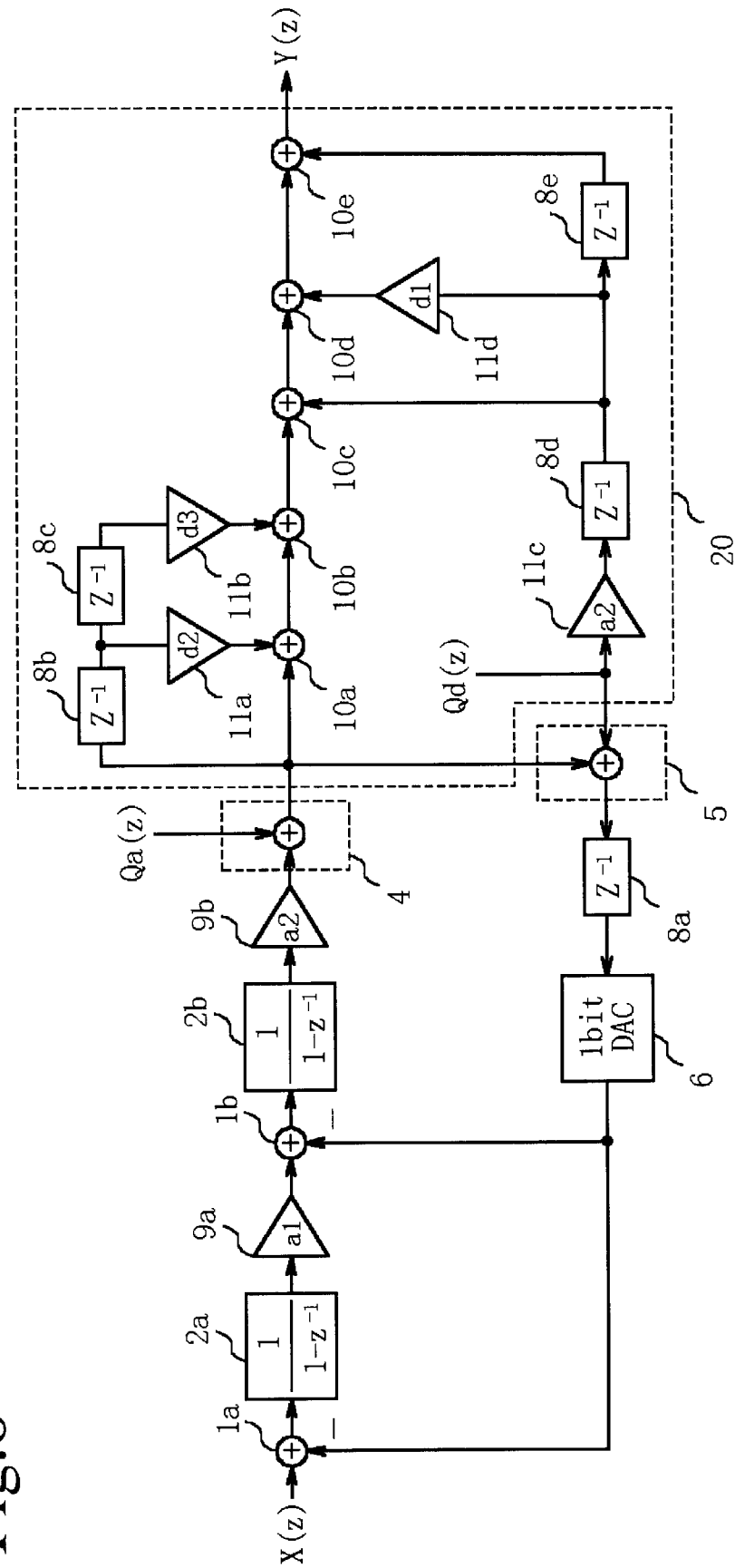
FIG. 8 is a block diagram of a fifth embodiment of the multi-bit ΔΣ A/D converter in accordance with the present invention.

FIG. 8 is a block diagram of a fifth embodiment of the multi-bit ΔΣ A/D converter in accordance with the present invention. In this A/D converter, similarly to the structure shown in FIG. 5, an analog adder 1a for receiving an input signal X(z), an analog integrator 2a, and an analog multiplier 9a, are connected in cascade as shown in FIG. 5. Succeedingly, similarly, an analog adder 1b, an analog integrator 2b, and an analog multiplier 9b are also connected in cascade. Following, a n-bit quantizer 4 and a most significant bit extractor 5 are further connected in cascade. An output of the most significant bit extractor 5 is held by a delay 8a until a next sampling time, and an output of the delay 8a is supplied through a one-bit D/A converter 6 to the analog adders 1a and 1b. Following the most significant bit extractor 5, a digital processing part 20 is located. In the structure shown in FIG. 8, a digital processing part 20 is located following the n-bit quantizer 4.

A structure of the digital processing part 20 is as follows: A delay 8b holds the output of the n-bit quantizer 4 until a next sampling time. An output of the delay 8b is multiplied with a coefficient d2 (d2=$a_1a_2+a_2-2$) by action of a digital multiplier 11a. Similarly, a delay 8c holds the output of the delay 8b until a further next sampling time. An output of the delay 8c is multiplied with a coefficient d3 (d3=$1-a_2$) by action of a digital multiplier 11b. A digital adder 10a outputs a sum of Y1(z) and an output of the digital multiplier 11a. Similarly, a digital adder 10b outputs a sum of an output of the digital adder 10a and an output of the digital multiplier 11b. A quantization noise Qd(z) mixed into with the most significant bit extractor 5 is extracted, and a digital multiplier 11c multiplies Qd(z) by a coefficient "$a_2$" of the second analog multiplier 9b. a delay 8d holds an output of the digital multiplier 11c until a still further next sampling time. A digital adder 10c outputs a sum of an output of the delay 8d and an output of the digital adder 10b. A digital adder 10d outputs a sum of an output of the digital adder 10c and a value obtained by multiplying the output of the delay 8d by a coefficient "$a_1$" of the analog multiplier 9a. A delay 8e holds an output of the delay 8d until a further next sampling time. A digital adder 10e outputs a sum of an output of the digital adder 10d and an output of the delay 8e. An output of the digital adder 10e constitutes the digital processing part 20 and an output of the A/D converter.

Here, a transfer function in Y1(z) becomes the following expression (31):

$$\{1+d2z^{-1}+d3z^{-2}\}Y1(z) = a_1a_2X(z)+(1-z^{-1})Qa(z)-a_2z^{-1}\{(1+a_1)-z^{-1}\}Qd(z) \quad (31)$$

A tranfer function of the digital processing part is expressed by the following expression (32):

$$Y(z)=\{1+d2z^{-1}+d3z^{-2}\}Y1(z)+a_2z^{-1}\{(1+a_1)-z^{-1}\}Qd(z) \quad (32)$$

From the expressions (31) and (32), the output Y(z) of the A/D converter becomes the following expression (33):

$$Y(z)=a_1a_2X(z)+(1-z^{-1})^2Qa(z) \quad (33)$$

The expression (33) is completely the same as the expression (21), and therefore, the structure shown in FIG. 8 becomes the similarity of the second embodiment.

Figure 9:
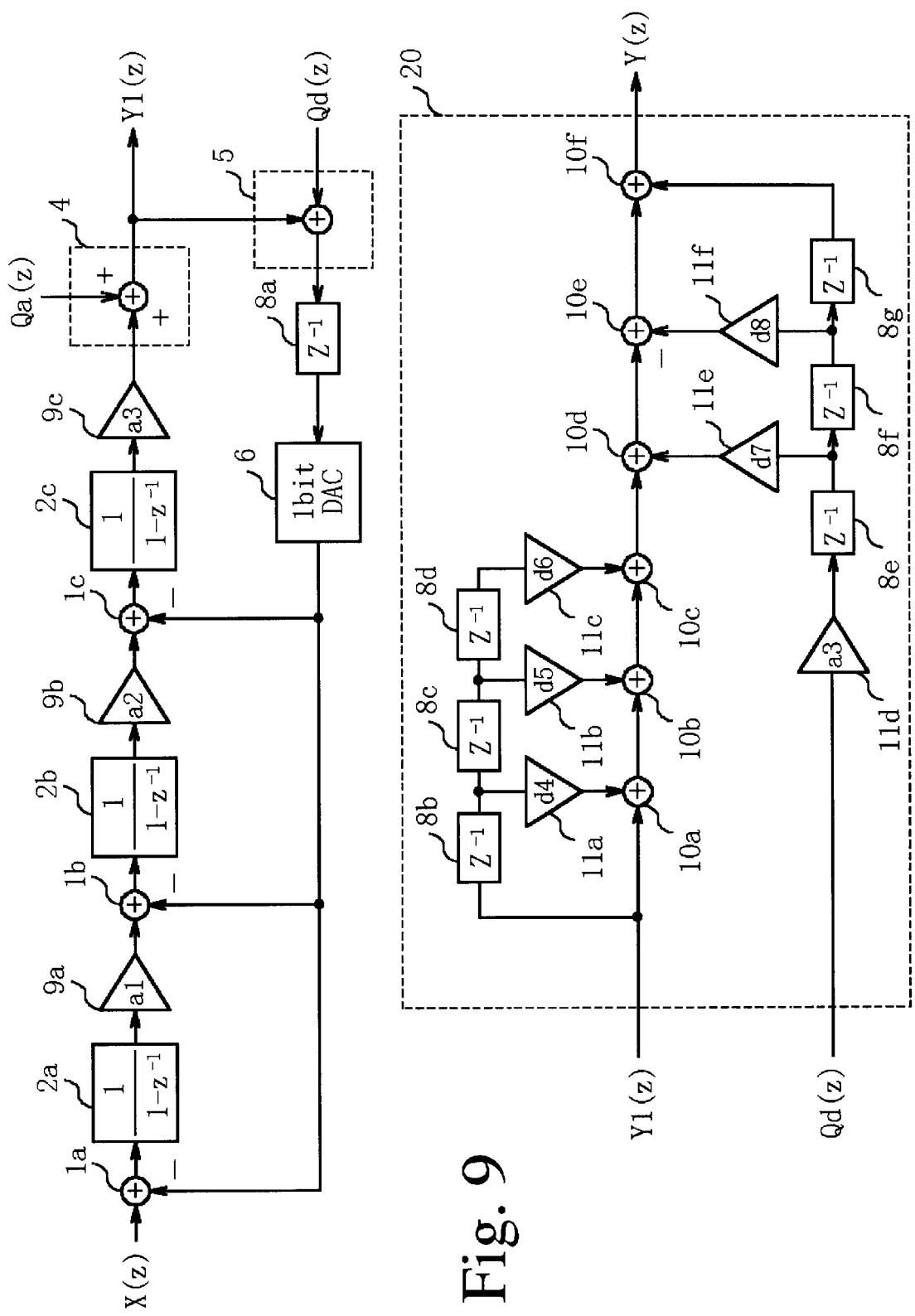
FIG. 9 is a block diagram of a sixth embodiment of the multi-bit ΔΣ A/D converter in accordance with the present invention.
Figure 10:
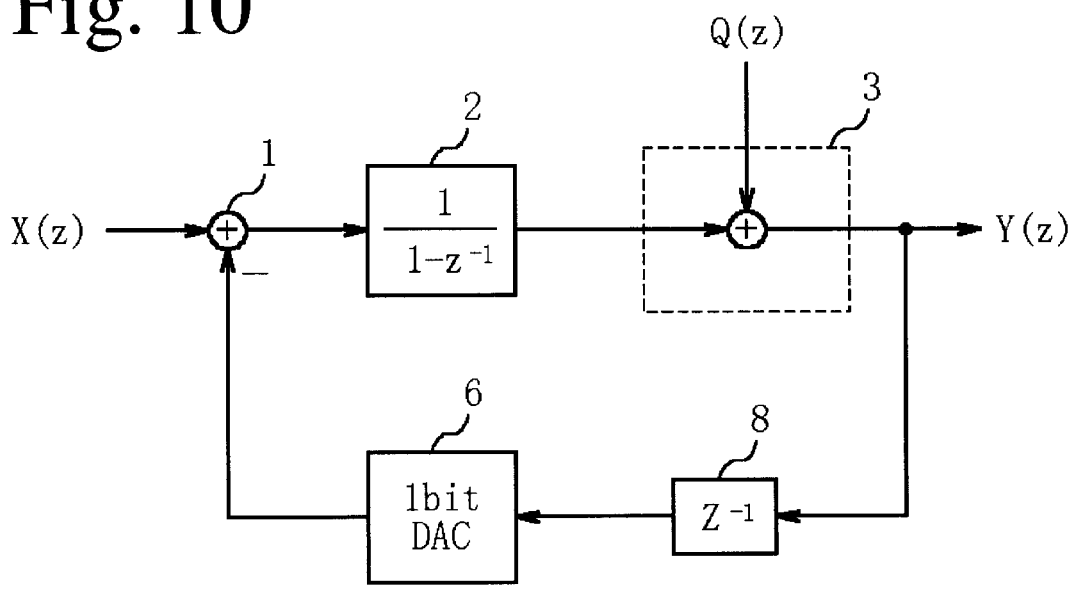
FIG. 10 is a block diagram illustrating a structure of a conventional one-bit quantization, first-order, multi-bit ΔΣ A/D converter.
Figure 12:
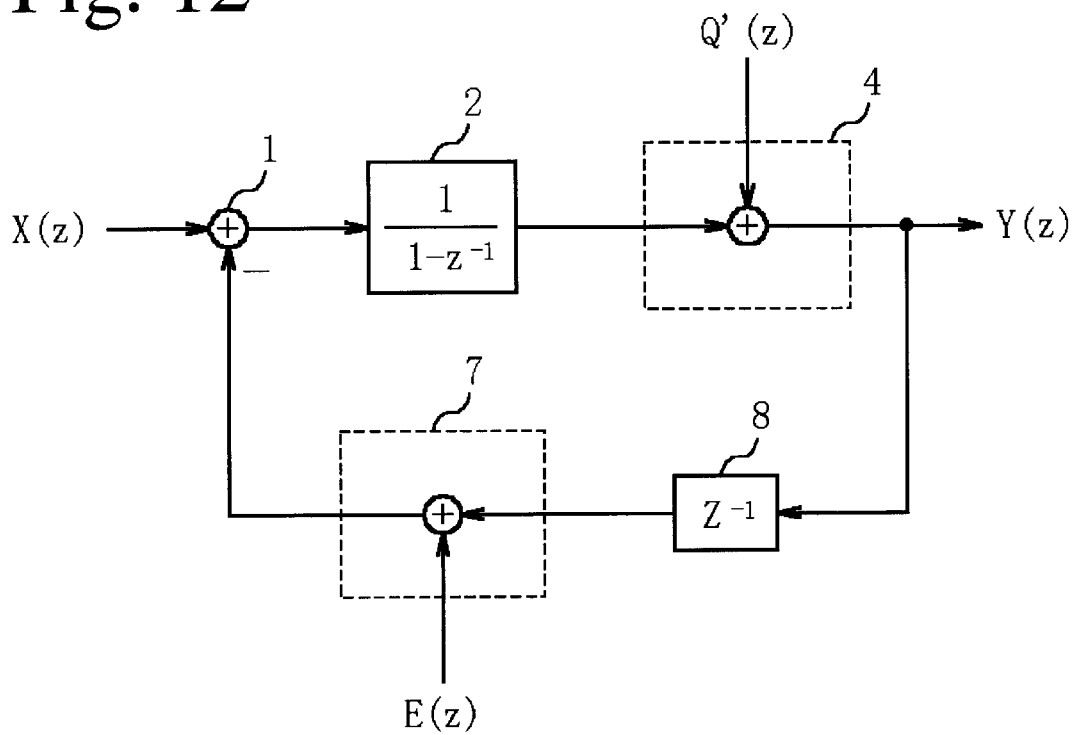
FIG. 12 is a block diagram illustrating a structure of a conventional one-bit quantization, first-order, multi-bit ΔΣ A/D converter.
Figure 11:
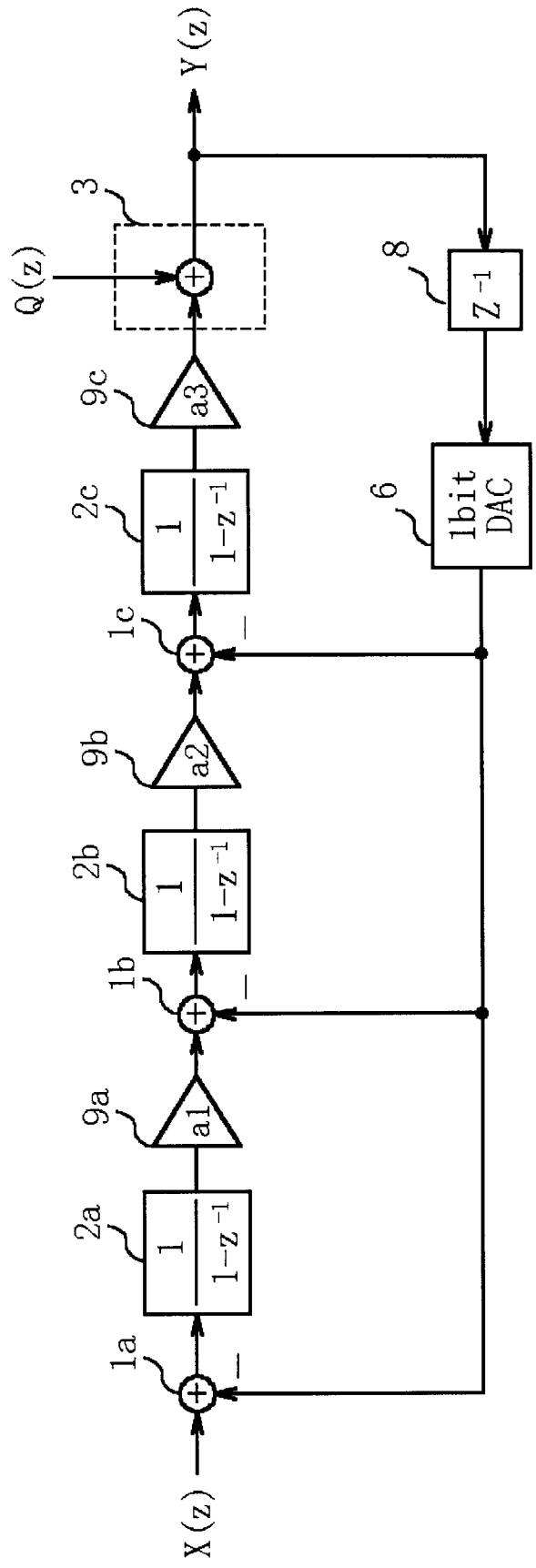
FIG. 11 is a block diagram illustrating a structure of a conventional one-bit quantization, third-order, multi-bit ΔΣ A/D converter.
Figure 13:
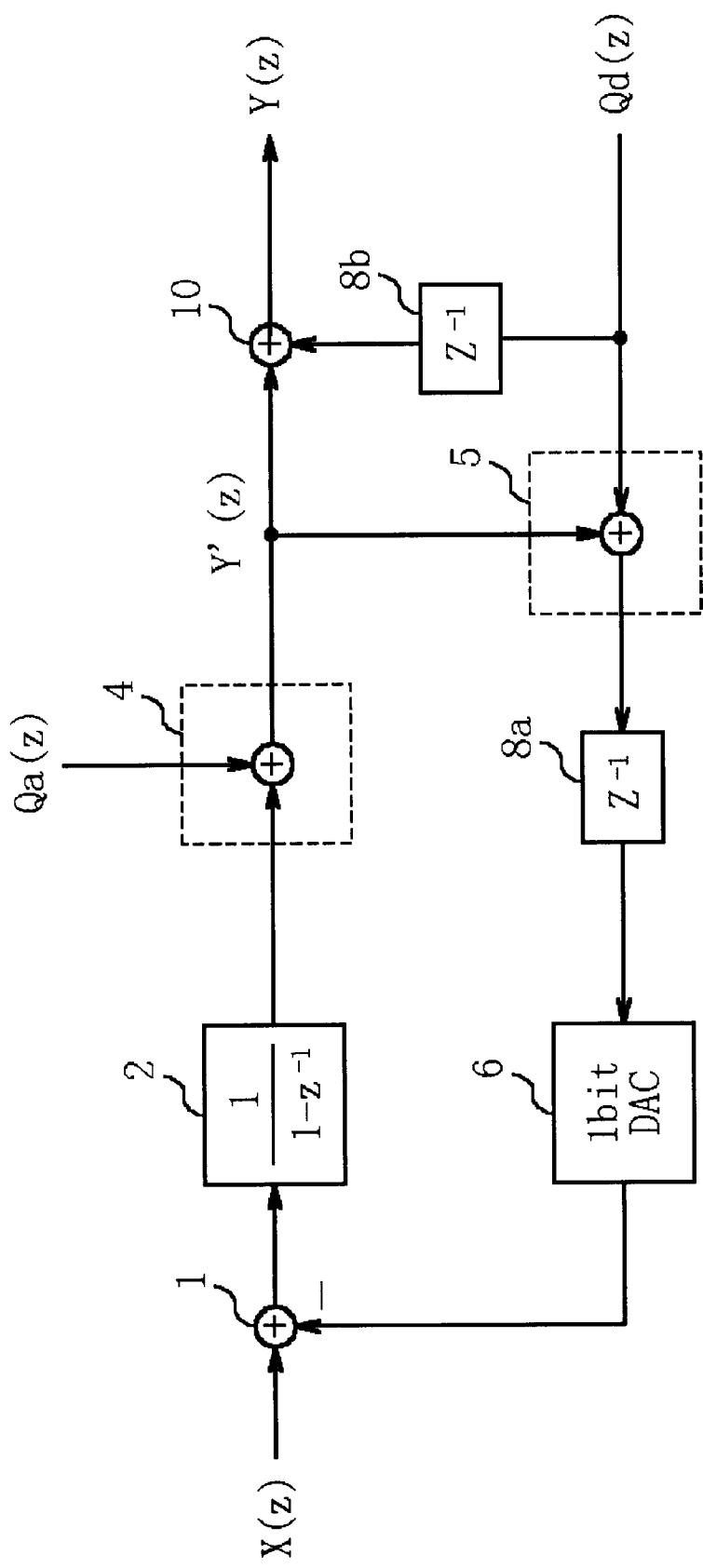
FIG. 13 is a block diagram illustrating a structure of a conventional first-order, multi-bit ΔΣ A/D converter.
Figure 14:
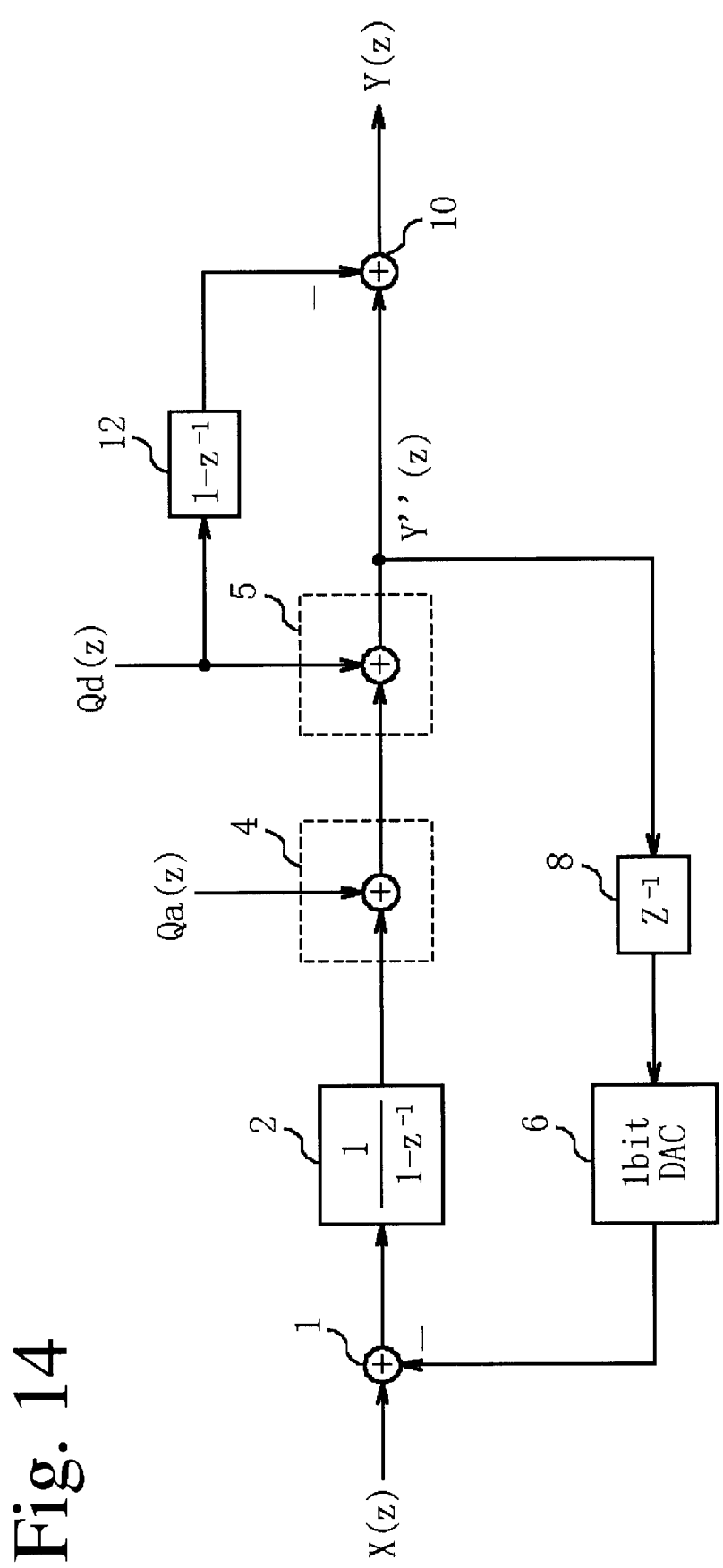
FIG. 14 is a block diagram illustrating a similarity of the structure shown in FIG. 13.
Figure 15:
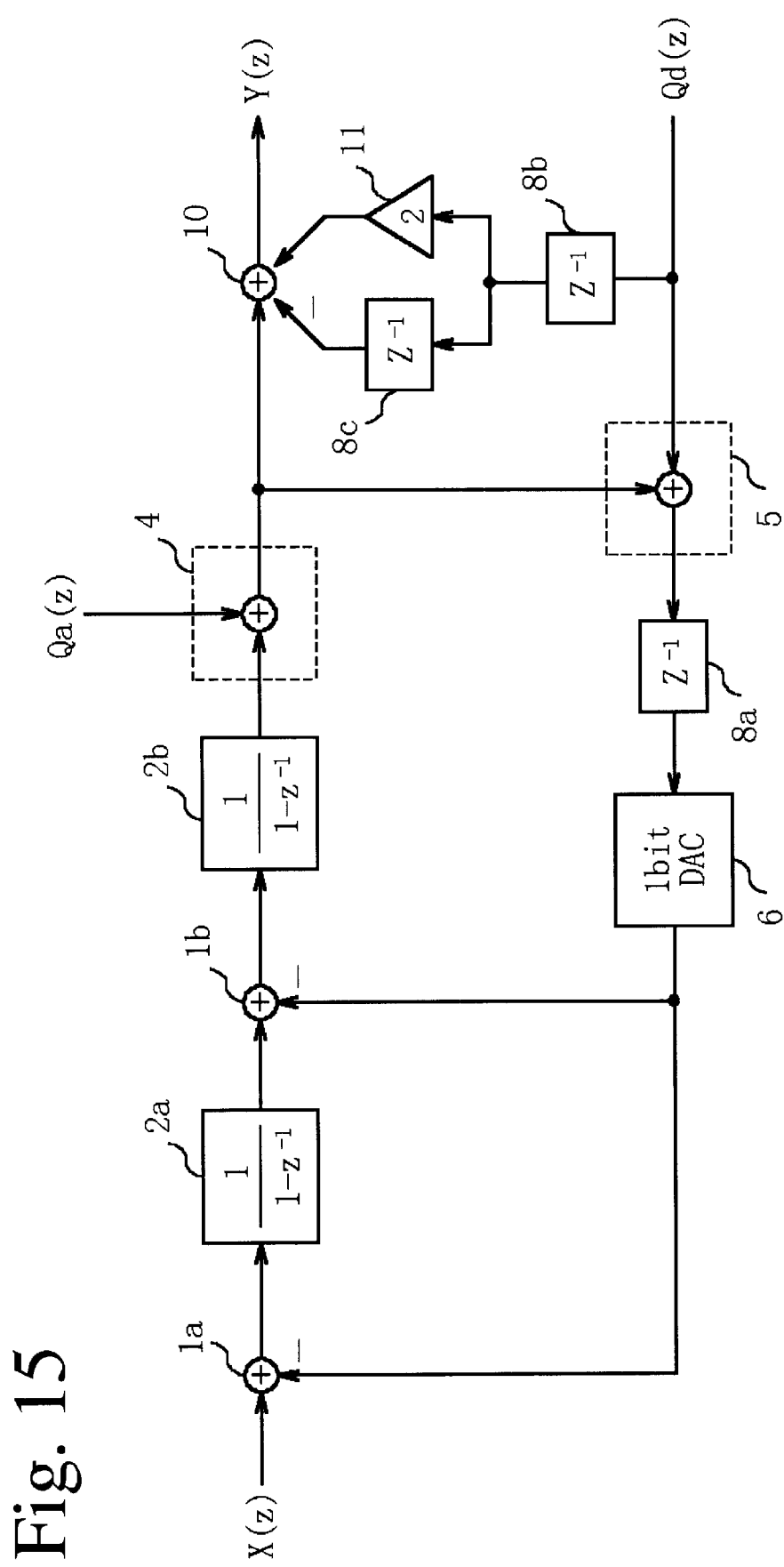
FIG. 15 is a block diagram illustrating a structure of a conventional second-order, multi-bit ΔΣ A/D converter.
Figure 16:
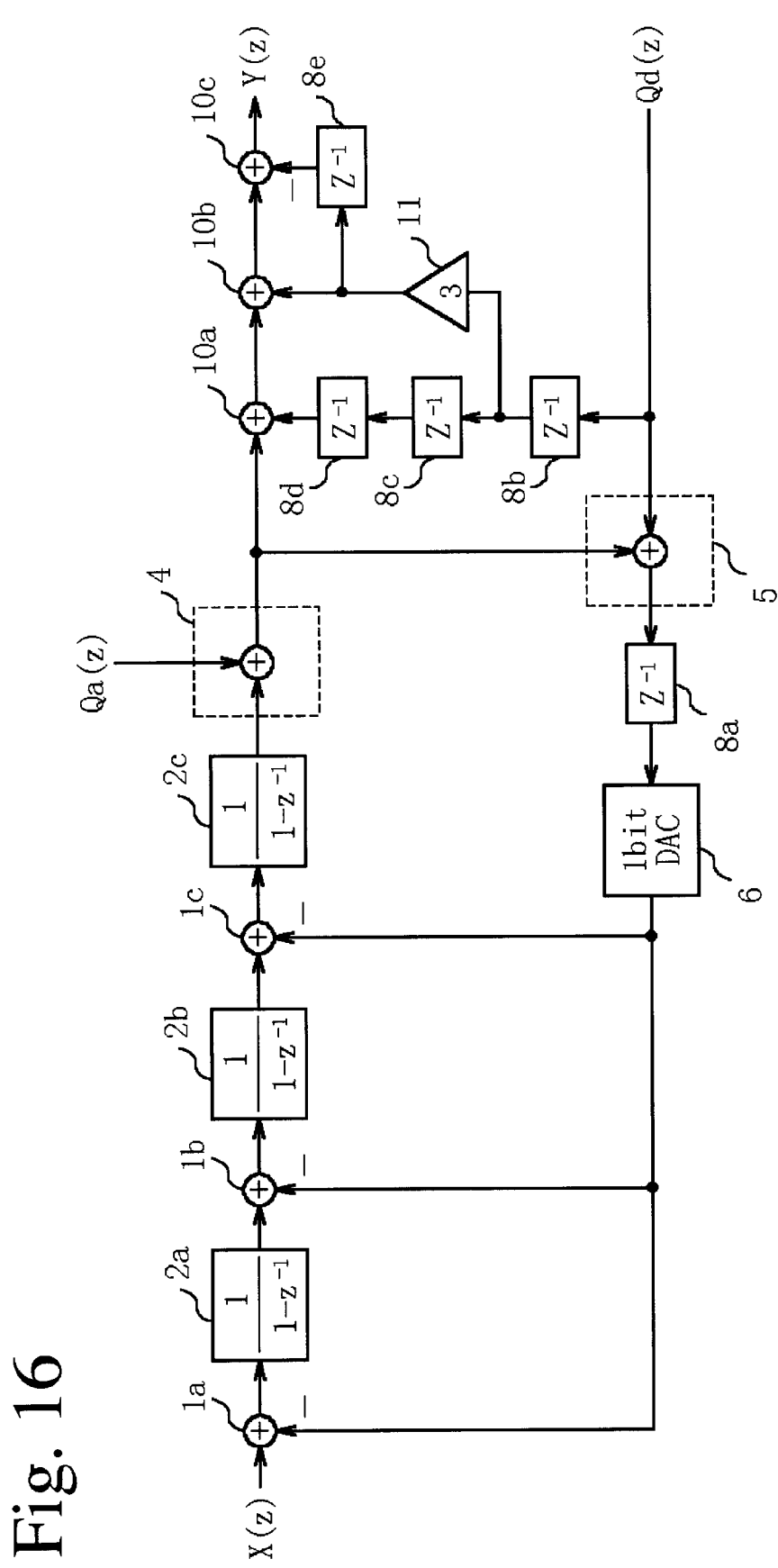
FIG. 16 is a block diagram illustrating a structure of a conventional third-order, multi-bit ΔΣ A/D converter.
Figure 17:
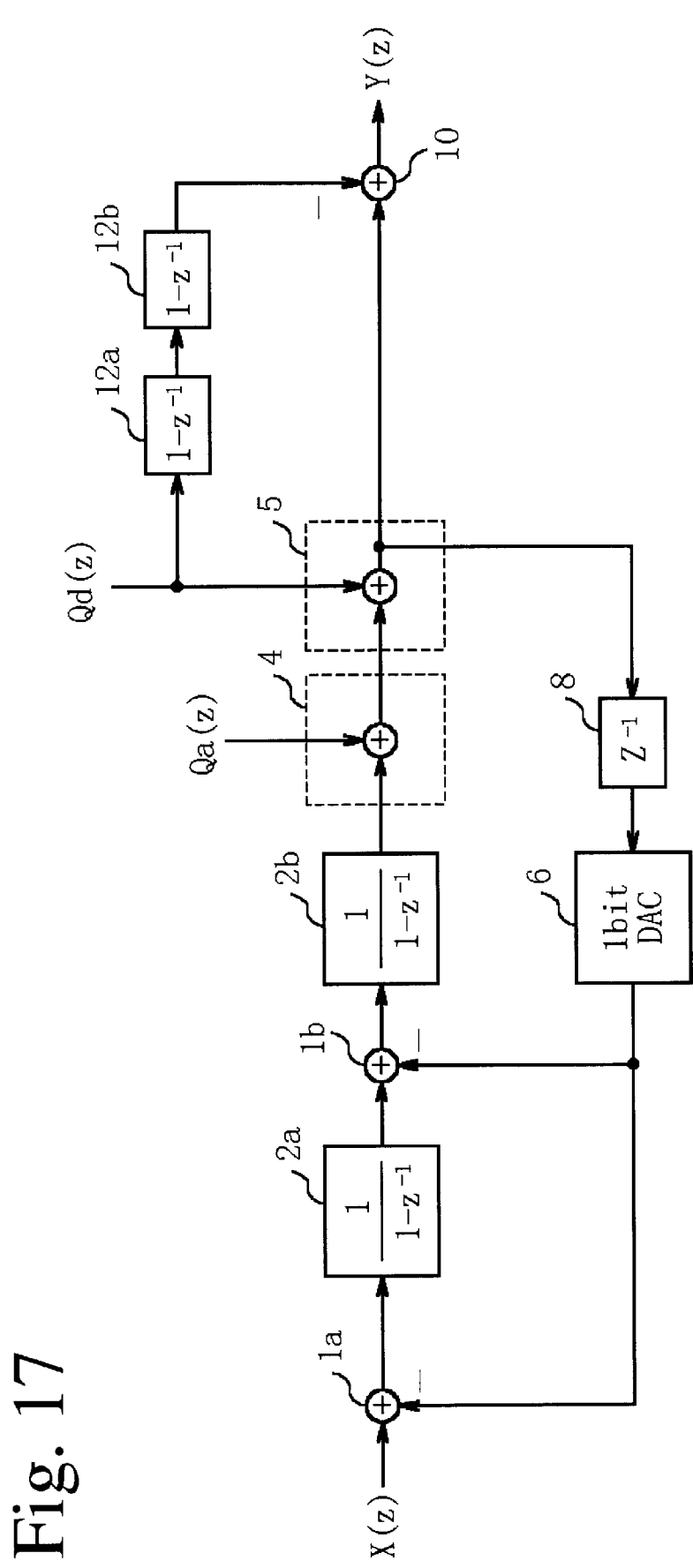
FIG. 17 is a block diagram illustrating a similarity of the structure shown in FIG. 15.
Figure 18:
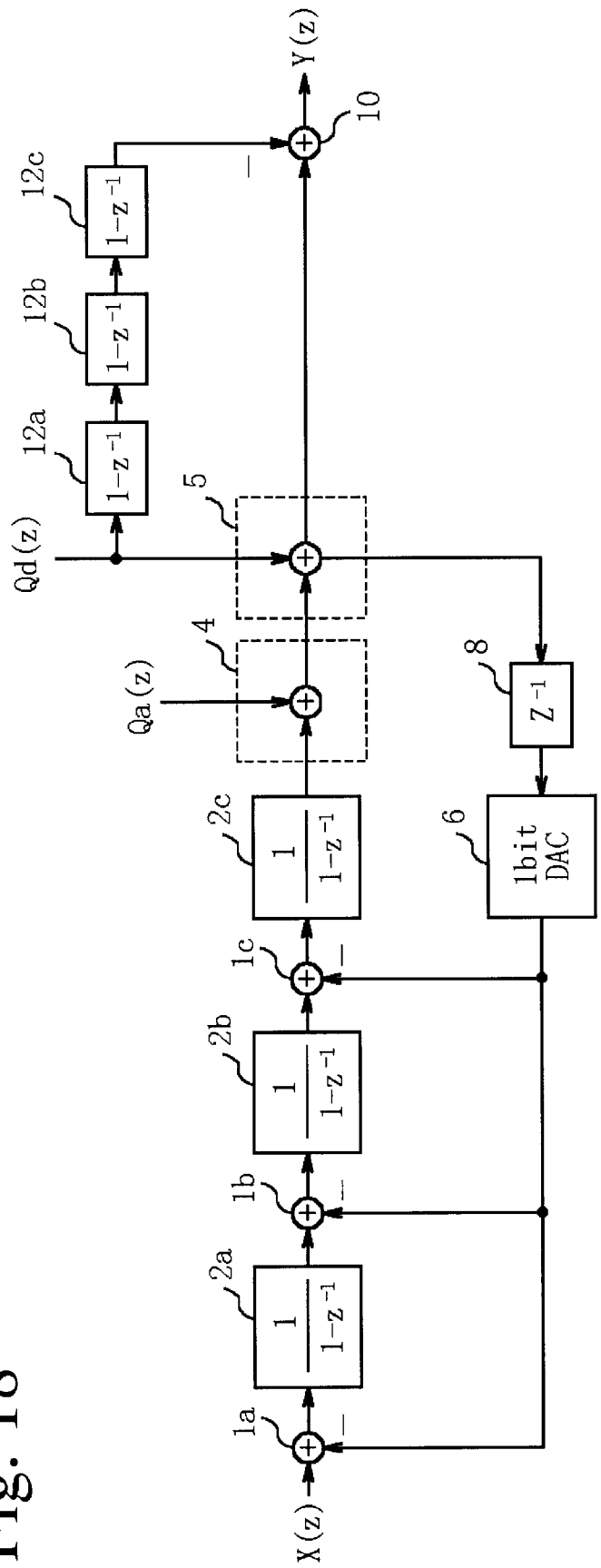
FIG. 18 is a block diagram illustrating a similarity of the structure shown in FIG. 16.

FIG. 9 is a block diagram of a sixth embodiment of the multi-bit ΔΣ A/D converter in accordance with the present invention. In this A/D converter, following the analog adder 1b, the analog integrator 2b and the analog multiplier 9b shown in FIG. 8, an analog adder 1c, an analog integrator 2c, and an analog multiplier 9c are further connected in cascade. Furthermore, a n-bit quantizer 4 and a most significant bit extractor 5 are connected in cascade. A delay 8a holds an output of the most significant bit extractor 5 until a next sampling time. An output of the delay 8a is supplied to the analog adders 1a, 1b and 1c. An output Y1(z) of the n-bit quantizer 4 is supplied to a digital processing part 20.

A structure of the digital processing part 20 is as follows: A delay 8b holds Y1(z) until a next sampling time. A digital multiplier 11a multiplies an output of the delay 8b by a coefficient d4 (d4=$a_1a_2a_3+a_2a_3+a_3-3$). A delay 8c holds the output of the delay 8b until a further next sampling time. A digital multiplier 11b multiplies an output of the delay 8c by a coefficient d5 (d5=$3-a_2a_3-2a_3$). A delay 8d holds the output of the delay 8c until a still further next sampling time. A digital multiplier 11c multiplies an output of the delay 8d by a coefficient d6 (d6=$a_3-1$).

A digital adder 10a outputs the input Y1(z) of the digital processing part 20 and an output of the digital multiplier 11a. Similarly, a digital adder 10b outputs a sum of an output of the digital adder 10a and an output of the digital multiplier 11b. A digital adder 10c outputs a sum of an output of the digital adder 10b and an output of the digital multiplier 11c. A quantization noise Qd(z) mixed into with the most significant bit extractor 5 is multiplied by a coefficient "$a_3$" of the third analog multiplier 9c, by action of a digital multiplier 11d. A delay 8e holds an output of the digital multiplier 11d until a next sampling time, and the held data is multiplied by a coefficient d7 (d7=$a_1a_2+a_2+1$) expressed in the following expression, by action of a digital multiplier 11e. A delay 8f holds an output of the delay 8e until a further next sampling time, and the held data is multiplied by a coefficient d8 (d8=$a_2+2$) expressed in the following expression, by action of a digital multiplier 11f.

A digital adder 10d outputs a sum of an output of the digital adder 10c and an output of the digital multiplier 11e. A digital adder 10e outputs a difference between an output of the digital adder 10d and an output of the digital multiplier 11f. Finally, a digital adder 10f outputs a sum of an output of the digital adder 10e and an output of a delay 8g. An output of the digital adder 10f constitutes the digital processing part 20 and an output of the A/D converter.

Here, a transfer function in Y1(z) becomes the following expression (34):

$$\{1+d4z^{-1}+d5z^{-2}+d6z^{-3}\}Y1(z) = a_1a_2a_3X(z)+(1-z^{-1})^3Qa(z)-a_3(d7z^{-1}-d8z^{-2}+z^{-3})Qd(z) \quad (34)$$

A tranfer function of the digital processing part 20 is expressed by the following expression (35):

$$Y(z)=\{1+d4z^{-1}+d5z^{-2}+d6z^{-3}\}Y1(z)+a_3(d7z^{-1}-d8z^{-2}+z^{-3})Qd(z) \quad (35)$$

From the expressions (34) and (35), the output Y(z) of the A/D converter becomes the following expression (36):

$$Y(z)=a_1a_2a_3X(z)+(1-z^{-1})^3Qa(z) \quad (36)$$

The expression (36) is completely the same as the expression (26), and therefore, the structure shown in FIG. 9 becomes the similarity of the third embodiment.

As seen from the above, according to the present invention, in order to suppress an output amplitude of an analog integrating means within a full scale of a multi-bit quantizing means, there is provided an analog multiplying means for multiplying an output signal of the analog integrating means by an arbitrary constant number, and there is also provided a digital processing means receiving an output of the multi-bit quantizing means to processing the same by using the arbitrary constant number in the analog multiplying means. Thus, a complete noise shape can be realized. In addition, if the digital processing means using the arbitrary constant number in the analog multiplying means is provided to the structure disclosed in the above referred publications, and if the digital quantization noise Qd(z) mixed into with a most significant bit extracting means is extracted and a difference from the signal which is differentiated by the same order as that of the analog integrating means, Qd(z) can be completely removed. Thus, it is possible to perform a highly precise conversion in comparison with the structure disclosed in the above referred publications. In addition, it is possible to realize a multi-bit ΔΣ A/D converter having a reduced number of analog circuit elements, capable of elevating the degree of the precision of conversion and of increasing the band width, with neither increasing the sampling frequency nor elevating the order of the analog integrator.

As mentioned above, the multi-bit ΔΣ A/D converter in accordance with the present invention can minimize the quantization noise within a signal band by using the n-bit quantizer, and also realize a high precision of conversion with a low oversampling ratio. In addition, it is possible to prevent deterioration of the frequency characteristics in the noise shaping attributable to the gain coefficient in the analog integrator.

In the disclosed embodiments, only the most significant bit of the data quantized by the n-bit quantizer is extracted by the most significant bit extractor and then fed back. Therefore, since the feedback to the input can be carried out by the one-bit D/A converter which essentially has no non-linear error, the A/D converter is not subjected to variation in fabrication process, and therefore, there occurs the deterioration of the precision attributable to the variation in fabrication process. In addition, no circuit for compensating for the non-linearity is required. Furthermore, since the one-bit D/A converter can be formed with only a unitary capacitor, the circuit area of the analog circuit does not increase. A large quantization noise Qd(z) mixed into with the most significant bit extractor can be removed by the digital differentiator or the digital processing part which is located at a later stage, so that a high precision of conversion can be obtained. Moreover, since the digital processing part located at the later stage performs the arithmetic operation in consideration of the gain coefficients of the analog integrators provided for the purpose of suppressing the signal within the full scale of the n-bit quantizer, Qd(z) can be completely removed so that a further high precision of conversion can be obtained.

What is claimed is:

1. A multi-bit ΔΣ A/D converter comprising an analog adding means for outputting a difference between an analog input signal and an analog feedback signal, an analog integrating means for integrating an output signal of said analog adding means, an analog multiplying means for multiplying an output of said analog integrating means by a predetermined coefficient, a multi-bit quantizing means for quantizing an output of said analog multiplying means with a plurality of bits, and a D/A converting means for converting a digital output signal outputted from said multi-bit quantizing means into an analog signal, said D/A converting means outputting said analog signal as said analog feedback signal in a next sampling time, wherein there is provided a digital processing means receiving said digital output signal outputted from said multi-bit quantizing means, for outputting a sum of said digital output signal and a value obtained by multiplying said digital output signal outputted before a predetermined time, by a predetermined coefficient, and a value obtained by subtracting from an output of said digital processing means a value obtained by differentiating a predetermined quantization noise, is outputted.

2. A multi-bit ΔΣ A/D converter claimed in claim 1 wherein the output Y(z) of the multi-bit ΔΣ A/D converter is $Y(z)=aX(z)+(1-z^{-1})Qa(z)$ where X(z) is an analog input signal to the multi-bit ΔΣ A/D converter;

a is a coefficient to be multiplied by the analog multiplying means;

Qa(z) is a quantization noise mixed into with the multi-bit quantizing means.

3. A multi-bit ΔΣ A/D converter claimed in claim 1 wherein said digital processing means includes a delay means for holding an output of said multi-bit quantizing means until a next sampling time, a digital multiplying means for multiplying an output of said delay means by a coefficient (a−1) and a first digital adding means for outputting a sum of the output of said multi-bit quantizing means and an output of said digital multiplying means.

4. A multi-bit ΔΣ A/D converter claimed in claim 1 wherein said multi-bit quantizing means includes a n-bit quantizer (where "n" is an integer not less than 2) and a most significant bit extractor located at a stage following said n-bit quantizer.

5. A multi-bit ΔΣ A/D converter claimed in claim 4, further including a digital differentiating means for differentiating a quantization noise mixed into with a most significant bit extractor, and a second digital adding means for outputting a difference between an output of said digital differentiating means and the output of said digital processing means, an output of said second digital adding means constituting an output of the multi-bit ΔΣ A/D converter.

6. A multi-bit ΔΣ A/D converter claimed in claim 1 wherein said D/A converting means includes a delay means for holding the output of said multi-bit quantizing means until a next sampling time, and a one-bit D/A converter for converting an output of said delay means into an analog signal.

7. A multi-bit ΔΣ A/D converter claimed in claim 1 wherein said D/A converting means includes a delay means for holding the output of said multi-bit quantizing means until a next sampling time, and a one-bit D/A converter for converting an output of said delay means into an analog signal.

8. A multi-bit ΔΣ A/D converter comprising "k" constitution stages (where "k" is a positive integer) connected in cascade, each of said constitution stages including an analog adding means receiving an analog input signal and an analog feedback signal for outputting a difference between said analog input signal and said analog feedback signal, an analog integrating means for integrating an output signal of said analog adding means, and an analog multiplying means for multiplying an output of said analog integrating means by a predetermined coefficient, a multi-bit quantizing means for quantizing an output of said analog multiplying means of the "k"th stage with a plurality of bits, and a D/A converting means for converting a digital output signal outputted from said multi-bit quantizing means into an analog signal, said D/A converting means outputting said analog signal to said analog adding means of said "k" stages, as said analog feedback signal in a next sampling time, wherein there is provided a digital processing means receiving said digital output signal outputted from said multi-bit quantizing means, for outputting a sum of said digital output signal and a value obtained by multiplying said digital output signal outputted before a predetermined time, by a predetermined coefficient, said digital processing means successively performing a similar adding processing for a result of said summing (k−1) times, and a value obtained by subtracting from an output of said digital processing means a value obtained by differentiating a predetermined quantization noise, is outputted.

9. A multi-bit ΔΣ A/D converter claimed in claim 8 wherein the output Y(z) of the multi-bit ΔΣ A/D converter is $Y(z)=(a_1 a_2 \ldots a_k)X(z)+(1-z^{-1})^k Qa(z)$ where X(z) is an analog input signal to the multi-bit ΔΣ A/D converter;

$a_1, a_2, \ldots a_k$ are respective coefficients to be multiplied by the analog multiplying means of the first to (k)th stages;

Qa(z) is a quantization noise mixed into with the multi-bit quantizing means.

10. A multi-bit ΔΣ A/D converter claimed in claim 8 wherein, k=2, and said digital processing means includes a first delay means for holding an output of said multi-bit quantizing means until a next sampling time, a first digital multiplying means for multiplying an output of said first delay means by a coefficient ($a_1a_2+a_2-2$), a first digital adding means for outputting a sum of the output of said multi-bit quantizing means and an output of said first digital multiplying means, a second delay means for holding an output of said first delay means until a further next sampling time, a second digital multiplying means for multiplying an output of said second delay means by a coefficient ($1-a_2$), and a second digital adding means for outputting a sum of the output of said first digital adding means and an output of said second digital multiplying means.

11. A multi-bit ΔΣ A/D converter claimed in claim 8 wherein, k=3, and said digital processing means includes a first delay means for holding an output of said multi-bit quantizing means until a next sampling time, a first digital multiplying means for multiplying an output of said first delay means by a coefficient ($a_1a_2a_3+a_2a_3+a_3-3$), a first digital adding means for outputting a sum of the output of said multi-bit quantizing means and an output of said first digital multiplying means, a second delay means for holding an output of said first delay means until a next sampling time, a second digital multiplying means for multiplying an output of said second delay means by a coefficient ($3-a_2a_3-2a_3$), a second digital adding means for outputting a sum of the output of said digital adding means and an output of said second digital multiplying means, a third delay means for holding an output of said second delay means until a next sampling time, a third digital multiplying means for multiplying an output of said third delay means by a coefficient ($a_3-1$), and a third digital adding means for outputting a sum of the output of said second digital adding means and an output of said third digital multiplying means.

12. A multi-bit ΔΣ A/D converter claimed in claim 11, further including a first digital differentiating means for differentiating a quantization noise mixed into with a most significant bit extractor, a second digital differentiating means for differentiating an output of said first digital differentiating means, a third digital differentiating means for differentiating an output of said second digital differentiating means, and a fourth digital adding means for outputting a difference between an output of said third digital differentiating means and the output of said digital processing means, an output of said fourth digital adding means constituting an output of the multi-bit ΔΣ A/D converter.

13. A multi-bit ΔΣ A/D converter claimed in claim 8 wherein said multi-bit quantizing means includes a n-bit quantizer (where "n" is an integer not less than 2) and a most significant bit extractor located at a stage following said n-bit quantizer.

14. A multi-bit ΔΣ A/D converter claimed in claim 10, further including a first digital differentiating means for differentiating a quantization noise mixed into with a most significant bit extractor, a second digital differentiating means for differentiating an output of said first digital differentiating means, and a third digital adding means for outputting a difference between an output of said second digital differentiating means and the output of said digital processing means, an output of said third digital adding means constituting an output of the multi-bit ΔΣ A/D converter.

15. A multi-bit ΔΣ A/D converter comprising an analog adding means for outputting a difference between an analog input signal and an analog feedback signal, an analog integrating means for integrating an output signal of said analog adding means, an analog multiplying means for multiplying an output of said analog integrating means by a predetermined coefficient, a multi-bit quantizing means for quantizing an output of said analog multiplying means with a plurality of bits, and a D/A converting means for converting a digital output signal outputted from said multi-bit quantizing means into an analog signal, said D/A converting means outputting said analog signal as said analog feedback signal in a next sampling time, wherein said multi-bit quantizing means includes a n-bit quantizer (where "n" is an integer not less than 2) and a most significant bit extractor located at a stage following said n-bit quantizer, wherein there is provided a digital processing means including a first delay means receiving an output of said n-bit quantizer, for holding said output of said n-bit quantizer for a predetermined time, a first digital multiplying means for multiplying an output of said first delay means by a predetermined coefficient, a first digital adding means for outputting a sum of the output of said n-bit quantizer and an output of said first digital multiplying means, a second delay means receiving a quantization noise mixed into with said most significant bit extractor, for holding said quantization noise for a predetermined time, a second digital multiplying means for multiplying an output of said second delay means by a predetermined coefficient, and a second digital adding means for outputting a sum of the output of said first digital adding means and an output of said second digital multiplying means, as an output of the multi-bit ΔΣ A/D converter.

16. A multi-bit ΔΣ A/D converter claimed in claim 15 wherein the output Y(z) of the multi-bit ΔΣ A/D converter is $$Y(z)=aX(z)+(1-z^{-1})Qa(z)$$

where X(z) is an analog input signal to the multi-bit ΔΣ A/D converter;

a is a coefficient to be multiplied by the analog multiplying means;

(a−1) is a coefficient to be multiplied by the first digital multiplying means;

a is a coefficient to be multiplied by the second digital multiplying means;

Qa(z) is a quantization noise mixed into with the n-bit quantizer.

17. A multi-bit ΔΣ A/D converter comprising two constitution stages connected in cascade, each of said constitution stages including an analog adding means for outputting a difference between an analog input signal and an analog feedback signal, an analog integrating means for integrating an output signal of said analog adding means, and an analog multiplying means for multiplying an output of said analog integrating means by a predetermined coefficient, a multi-bit quantizing means for quantizing an output of said analog multiplying means of the second stage with a plurality of bits, and a D/A converting means for converting a digital output signal outputted from said multi-bit quantizing means into an analog signal, said D/A converting means outputting said analog signal to said analog adding means of each stages, as said analog feedback signal in a next sampling time, wherein said multi-bit quantizing means includes a n-bit quantizer (where "n" is an integer not less than 2) and a most significant bit extractor located at a stage following said n-bit quantizer, wherein there is provided a digital processing means including a first delay means receiving an output of said n-bit quantizer, for holding said output of said n-bit quantizer for a predetermined time, a first digital multiplying means for multiplying an output of said first delay means by a predetermined coefficient, a first digital adding means for outputting a sum of the output of said n-bit quantizer and an output of said first digital multiplying means, a second delay means for holding the output of said first delay means for a predetermined time, a second digital multiplying means for multiplying an output of said second delay means by a predetermined coefficient, a second digital adding means for outputting a sum of the output of said first digital adding means and an output of said second digital multiplying means, a third digital multiplying means receiving a quantization noise mixed into with said most significant bit extractor, for multiplying said quantization noise by a predetermined coefficient, a third delay means for holding an output of said third digital multiplying means for a predetermined time, a third digital adding means for outputting a sum of the output of the second digital adding means and an output of said third delay means, a fourth digital multiplying means for multiplying an output of said third delay means by a predetermined coefficient, a fourth digital adding means for outputting a sum of said third digital adding means and an output of said fourth digital multiplying means, a fourth delay means for holding an output of said third delay means for a predetermined time, and a fifth digital adding means for outputting a sum of the output of said fourth digital adding means and an output of said fourth delay means, as an output of the multi-bit ΔΣ A/D converter.

18. A multi-bit ΔΣ A/D converter claimed in claim 17 wherein the output Y(z) of the multi-bit ΔΣ A/D converter is $$Y(z)=a_1a_2X(z)+(1-z^{-1})^2Qa(z)$$

where X(z) is an analog input signal to the multi-bit ΔΣ A/D converter;

$a_1$ and $a_2$ are respective coefficients to be multiplied by the first and second analog multiplying means;

$(a_1a_2+a_2-2)$, $(1-a_1)$, $a_2$, and $a_1$ are respective coefficients to be multiplied by the first to fourth digital multiplying means;

Qa(z) is a quantization noise mixed into with the n-bit quantizer.

19. A multi-bit ΔΣ A/D converter comprising three constitution stages connected in cascade, each of said constitution stages including an analog adding means for outputting a difference between an analog input signal and an analog feedback signal, an analog integrating means for integrating an output signal of said analog adding means, and an analog multiplying means for multiplying an output of said analog integrating means by a predetermined coefficient, a multi-bit quantizing means for quantizing an output of said analog multiplying means of the final stage with a plurality of bits, and a D/A converting means for converting a digital output signal outputted from said multi-bit quantizing means into an analog signal, said D/A converting means outputting said analog signal to said analog adding means of each stages, as said analog feedback signal in a next sampling time, wherein said multi-bit quantizing means includes a n-bit quantizer (where "n" is an integer not less than 2) and a most significant bit extractor located at a stage following said n-bit quantizer, wherein there is provided a digital processing means including a first delay means receiving an output of said n-bit quantizer, for holding said output of said n-bit quantizer for a predetermined time, a first digital multiplying means for multiplying an output of said first delay means by a predetermined coefficient, a first digital adding means for outputting a sum of the output of said n-bit quantizer and an output of said first digital multiplying means, a second delay means for holding the output of said first delay means for a predetermined time, a second digital multiplying means for multiplying an output of said second delay means by a predetermined coefficient, a second digital adding means for outputting a sum of the output of said first digital adding means and an output of said second digital multiplying means, a third delay means for holding the output of said second delay means for a predetermined time, a third digital multiplying means for multiplying an output of said third delay means by a predetermined coefficient, a third digital adding means for outputting a sum of the output of said second digital adding means and an output of said third digital multiplying means, a fourth digital multiplying means receiving a quantization noise mixed into with said most significant bit extractor, for multiplying said quantization noise by a predetermined coefficient, a fourth delay means for holding an output of said fourth digital multiplying means for a predetermined time, a fifth digital adding means for multiplying an output of said fourth delay means by a predetermined coefficient, a fourth digital adding means for outputting a sum of the output of the third digital adding means and an output of said fifth digital adding means, a fifth delay means for holding an output of said fourth delay means for a predetermined time, a sixth digital multiplying means for multiplying an output of said fifth delay means by a predetermined coefficient, a fifth digital adding means for outputting a sum of said fourth digital adding means and an output of said fifth digital multiplying means, a sixth delay means for holding an output of said fifth delay means for a predetermined time, and a sixth digital adding means for outputting a sum of the output of said fifth digital adding means and an output of said sixth delay means, as an output of the multi-bit ΔΣ A/D converter.

20. A multi-bit ΔΣ A/D converter claimed in claim 19 wherein the output Y(z) of the multi-bit ΔΣ A/D converter is $$Y(z)=a_1a_2a_3X(z)+(1-z^{-1})^3Qa(z)$$

where X(z) is an analog input signal to the multi-bit ΔΣ A/D converter;

$a_1$, $a_2$ and $a_3$ are respective coefficients to be multiplied by the first to third analog multiplying means;

$(a_1a_2a_3+a_2a_3+a_3-3)$, $(3-a_2a_3-2a_3)$, $(a_3-1)$, $a_3$, $(a_1a_2+a_2+1)$, $(a_2+2)$ are respective coefficients to be multiplied by the first to sixth digital multiplying means;

Qa(z) is a quantization noise mixed into with the n-bit quantizer.

* * * * *